(12) United States Patent
Yang et al.

(10) Patent No.: US 10,567,009 B2
(45) Date of Patent: Feb. 18, 2020

(54) DYNAMIC ERASURE CODING

(71) Applicant: Nutanix, Inc., San Jose, CA (US)

(72) Inventors: Minghui Yang, Fremont, CA (US);
Timothy Sujay Isaacs, San Jose, CA (US); Ajaykrishna Raghavan, Santa Clara, CA (US); Dmitri Bronnikov, Foster City, CA (US); Jaya Singhvi, Cupertino, CA (US); Peihong Huang, San Jose, CA (US); Varun Kumar Arora, Santa Clara, CA (US)

(73) Assignee: Nutanix, Inc., San Jose, CA (US)

( * ) Notice: Subject to any disclaimer, the term of this patent is extended or adjusted under 35 U.S.C. 154(b) by 60 days.

(21) Appl. No.: 15/833,962

(22) Filed: Dec. 6, 2017

(65) Prior Publication Data

US 2019/0332473 A1    Oct. 31, 2019

Related U.S. Application Data

(60) Provisional application No. 62/430,901, filed on Dec. 6, 2016.

(51) Int. Cl.
*H03M 13/35* (2006.01)
*H03M 13/15* (2006.01)
*G06F 11/10* (2006.01)

(52) U.S. Cl.
CPC ....... *H03M 13/356* (2013.01); *G06F 11/1076* (2013.01); *H03M 13/154* (2013.01)

(58) Field of Classification Search
CPC .................................................. H03M 13/356
See application file for complete search history.

(56) References Cited

U.S. PATENT DOCUMENTS

| 5,208,813 A | 5/1993 | Stallmo |
| 5,235,601 A | 8/1993 | Stallmo et al. |

(Continued)

FOREIGN PATENT DOCUMENTS

| EP | 1324200 A3 | 7/2003 |
| WO | WO 2002029539 A2 | 4/2002 |

OTHER PUBLICATIONS

B. K. Rai, "Adaptive erasure code based distributed storage systems," 2015 IEEE 14th Canadian Workshop on Information Theory (CWIT), St. John's, NL, pp. 174-177, 2015.*

(Continued)

*Primary Examiner* — Steve N Nguyen
(74) *Attorney, Agent, or Firm* — Vista IP Law Group, LLP

(57) ABSTRACT

Dynamic erasure coding for computing and data storage systems. A method embodiment commences upon accessing a set of fault tolerance policy attributes associated with the computing and data storage system. The topology of the system is analyzed to form mappings between the computing nodes of the system and the availability domains of the system. Based on the fault tolerance policy attributes, the topology, and the generated mapping, a plurality of feasible erasure coding configurations are generated. The feasible erasure coding configurations are scored. One or more high-scoring feasible erasure coding configurations are selected and deployed to the computing and data storage system. The method is repeated when there is a change in the fault tolerance policy attributes or in the topology. Depending on the topology and/or the nature of a change in the topology, more than one erasure coding configurations can be deployed onto the computing and data storage system.

20 Claims, 15 Drawing Sheets

(56) References Cited

U.S. PATENT DOCUMENTS

| | | | |
|---|---|---|---|
| 5,390,187 | A | 2/1995 | Stallmo |
| 5,485,571 | A | 1/1996 | Menon |
| 5,513,192 | A | 4/1996 | Janku et al. |
| 5,519,844 | A | 5/1996 | Stallmo |
| 5,522,032 | A | 5/1996 | Franaszek et al. |
| 5,537,567 | A | 7/1996 | Galbraith et al. |
| 5,550,849 | A | 8/1996 | Harrington |
| 5,613,059 | A | 3/1997 | Stallmo et al. |
| 5,617,530 | A | 4/1997 | Stallmo et al. |
| 5,708,769 | A | 1/1998 | Stallmo |
| 5,737,744 | A | 4/1998 | Callison et al. |
| 5,761,402 | A | 6/1998 | Kaneda et al. |
| 5,862,158 | A | 1/1999 | Baylor et al. |
| 5,911,779 | A | 6/1999 | Stallmo et al. |
| 6,282,671 | B1 | 8/2001 | Islam et al. |
| 6,298,415 | B1 | 10/2001 | Riedle |
| 6,353,895 | B1 | 3/2002 | Stephenson |
| 6,871,317 | B1 | 3/2005 | Corbett |
| 7,080,278 | B1 | 7/2006 | Kleiman et al. |
| 7,162,684 | B2 | 1/2007 | Hocevar |
| 7,321,905 | B2 | 1/2008 | Hartline et al. |
| 8,549,518 | B1 | 10/2013 | Aron et al. |
| 8,601,473 | B1 | 12/2013 | Aron et al. |
| 8,850,130 | B1 | 9/2014 | Aron et al. |
| 9,595,979 | B2 * | 3/2017 | Blaum ............... H03M 13/373 |
| 9,672,106 | B2 | 6/2017 | Bronnikov et al. |
| 9,768,808 | B2 * | 9/2017 | Sprouse ............. H03M 13/353 |
| 9,772,866 | B1 | 9/2017 | Aron et al. |
| 9,817,713 | B2 * | 11/2017 | Gupta ................. G06F 11/1064 |
| 2002/0194530 | A1 | 12/2002 | Santeler et al. |
| 2003/0126523 | A1 | 7/2003 | Corbett et al. |
| 2004/0148560 | A1 | 7/2004 | Hocevar |
| 2005/0160307 | A1 | 7/2005 | Schmisseur |
| 2007/0089045 | A1 | 4/2007 | Corbett et al. |
| 2010/0083069 | A1 * | 4/2010 | Wylie .................. H03M 13/01 714/752 |
| 2011/0010599 | A1 | 1/2011 | Goel et al. |
| 2011/0185258 | A1 * | 7/2011 | Grube .................. G06F 16/182 714/763 |
| 2014/0208022 | A1 | 7/2014 | Gordon |
| 2014/0372689 | A1 | 12/2014 | Colgrove et al. |
| 2015/0236724 | A1 * | 8/2015 | Reinart ............... H03M 13/373 714/774 |
| 2016/0294419 | A1 * | 10/2016 | Sandell ................ H03M 13/35 |
| 2017/0033806 | A1 * | 2/2017 | Arslan ................ H03M 13/356 |

OTHER PUBLICATIONS

International Search Report and Written Opinion dated Mar. 29, 2016 for corresponding PCT Patent Application No. PCT/US2015/068162, 16 pages.

Tom Fuja et al., "Cross Parity Check Convolutional Codes," IEEE Transactions on Information Theory, vol. 35, No. 6, Nov. 1989.

Poitras, Steven. "The Nutanix Bible" (Oct. 15, 2013), from http://stevenpoitras.com/the-nutanix-bible/ (Publication date based on indicated capture date by Archive.org; first publication date unknown).

Poitras, Steven. "The Nutanix Bible" (Jan. 11, 2014), from http://stevenpoitras.com/the-nutanix-bible/ (Publication date based on indicated capture date by Archive.org; first publication date unknown).

Poitras, Steven. "The Nutanix Bible" (Jun. 20, 2014), from http://stevenpoitras.com/the-nutanix-bible/ (Publication date based on indicated capture date by Archive.org; first publication date unknown).

Poitras, Steven. "The Nutanix Bible" (Jan. 7, 2015), from http://stevenpoitras.com/the-nutanix-bible/ (Publication date based on indicated capture date by Archive.org; first publication date unknown).

Poitras, Steven. "The Nutanix Bible" (Jun. 9, 2015), from http://stevenpoitras.com/the-nutanix-bible/ (Publication date based on indicated capture date by Archive.org; first publication date unknown).

Poitras, Steven. "The Nutanix Bible" (Sep. 4, 2015), from https://nutanixbible.com/.

Poitras, Steven. "The Nutanix Bible" (Jan. 12, 2016), from https://nutanixbible.com/.

Poitras, Steven. "The Nutanix Bible" (Jun. 9, 2016), from , https://nutanixbible.com/.

Poitras, Steven. "The Nutanix Bible" (Jan. 3, 2017), from , https://nutanixbible.com/.

Poitras, Steven. "The Nutanix Bible" (Jun. 8, 2017), from https://nutanixbible.com/.

Poitras, Steven. "The Nutanix Bible" (Jan. 3, 2018), from https://nutanixbible.com/.

Poitras, Steven. "The Nutanix Bible" (Jun. 25, 2018), from https://nutanixbible.com/.

Poitras, Steven. "The Nutanix Bible" (Jan. 8, 2019), from https://nutanixbible.com/.

Non-Final Office Action dated Sep. 2, 2016 for U.S. Appl. No. 14/586,628, 11 pages.

Notice of Allowance dated Jan. 31, 2017 for U.S. Appl. No. 14/586,628, 6 pages.

Cano, I. et al., "Curator: Self-Managing Storage for Enterprise Clusters", *14th Usenix Symposium on Networked Systems Design and Implementation, NSDI '17*, (Mar. 27, 2017).

\* cited by examiner

DYNAMIC ERASURE CODING

RELATED APPLICATIONS

The present application claims the benefit of priority to U.S. Patent Application Ser. No. 62/430,901 titled, "DYNAMIC RECONFIGURATION OF ERASURE CODING STRIPS IN A HETEROGENEOUS CLUSTER", filed Dec. 6, 2016, which is hereby incorporated by reference in its entirety.

FIELD

This disclosure relates to data storage, and more particularly to techniques for dynamic configuration of erasure coding in computing systems.

BACKGROUND

Modern distributed computing systems have evolved to be able to coordinate deployment and use of different types of computing resources, storage resources, networking resources, and/or other computing resources in such a way that incremental scaling can be accomplished by adding additional computing capabilities or storage capabilities, or networking capabilities, etc. For example, a computing system might be composed of hundreds of nodes or more, any one of which nodes might support several thousand or more autonomous virtualized entities (VEs), such as virtual machines (VMs), that are individually tasked to perform one or more of a broad range of computing and/or storage workloads. As the workloads fluctuate, the demand on the resources of the distributed computing system can fluctuate dynamically as well. In some cases, system administrators might address fluctuating resource demands by adding or subtracting nodes. In some cases, administrators might deploy certain types of nodes that are configured so as to handle particular classes or types of workloads (e.g., storage-centric workloads), while other nodes might be configured to handle other classes or types of workloads (e.g., compute-centric workloads). Administrators might also change the physical and/or logical arrangement (e.g., topology) of the nodes based on the then-current or forecasted resource usage and/or workload schedule. Such ongoing changes result in a highly dynamic, ever-changing, computing system.

The highly dynamic, ever-changing, nature of modern computing systems combined with the ever-increasing storage demands of such computing systems has exacerbated the need for highly configurable storage resources to be added at will into such mixed node-type computing systems. For example, in many environments, such computing systems comprise aggregated physical storage facilities that implement a logical storage pool within which stored data needs to be efficiently distributed and/or replicated according to various metrics and/or objectives. Users of these computing systems have a data consistency expectation that the platform is able to provide consistent and predictable storage behavior (e.g., availability, accuracy, etc.) for all types of data (e.g., data and metadata).

Administrators can address such expectations by implementing a fault tolerance policy (e.g., specified in or derived from a service level agreement (SLA)) to facilitate a certain degree of fault tolerance in case of a node and/or storage device failure. At the same time, administrators are also tasked with managing the storage capacity consumed by the working data and replicated data in the system. Erasure coding (EC) is one technique that might be implemented to reduce the overall storage capacity demand on the computing and storage system while maintaining compliance with fault tolerance policies, replication factor policies and/or other data availability policies. Erasure coding works by forming a parity block that corresponds to two or more data blocks. If one of the data blocks is lost, it can be reconstructed through combining the data of one or more of the data blocks that was not lost together with the parity block, thus reconstructing the data of the lost block. As a simple example, if block $B1=1$ and block $B2=0$, then the parity block over block B1 and B2 is $P1=1$, so as to achieve parity in the combination. If block B2 is lost, then given the combination of $B1=1$ and $P1=1$, then it can be known that B2 must have been 0. This simple example can be extended to cover more complex erasure coding configurations, possibly involving more data blocks and possibly involving more parity blocks.

Unfortunately, applying an erasure coding configuration to a computing system relies on administrative determinations. As computing systems become more complex, this places an undue burden on the system administrators.

Furthermore, when relying on administrative approaches, manually determining appropriate erasure coding configurations for a computing system often leads to suboptimal configurations, and implementing a change from one particular EC configuration to another EC configuration can be costly and or bothersome. What is needed is a technological solution to reduce the burden on administrators when determining and implementing erasure coding in dynamically-changing computing and storage systems.

SUMMARY

The present disclosure provides a detailed description of techniques used in systems, methods, and in computer program products for dynamic erasure coding, which techniques advance the relevant technologies to address technological issues with legacy approaches. More specifically, the present disclosure provides a detailed description of techniques used in systems, methods, and in computer program products for determining and managing multiple erasure coding schemes in heterogenous computing and storage environments. Certain embodiments are directed to technological solutions for implementing a multi-objective selection technique to dynamically select erasure coding configurations in heterogeneous computing and storage systems.

The disclosed embodiments modify and improve over legacy approaches. In particular, the herein-disclosed techniques provide technical solutions that address the technical problems attendant to efficiently implementing erasure coding in heterogeneous computing and storage systems. Various applications of the herein-disclosed improvements in computer functionality serve to reduce the demand for computer memory, reduce the demand for computer processing power, reduce network bandwidth use, and reduce the demand for inter-component communication. Some embodiments disclosed herein use techniques to improve the functioning of multiple systems within the disclosed environments, and some embodiments advance peripheral technical fields as well. As one specific example, use of the disclosed techniques and devices within the shown environments as depicted in the figures provide advances in the technical field of hyperconverged computing platform management as well as advances in various technical fields related to distributed storage systems.

Further details of aspects, objectives, and advantages of the technological embodiments are described herein and in the drawings and claims.

BRIEF DESCRIPTION OF THE DRAWINGS

The drawings described below are for illustration purposes only. The drawings are not intended to limit the scope of the present disclosure.

DETAILED DESCRIPTION

Figure 1A:
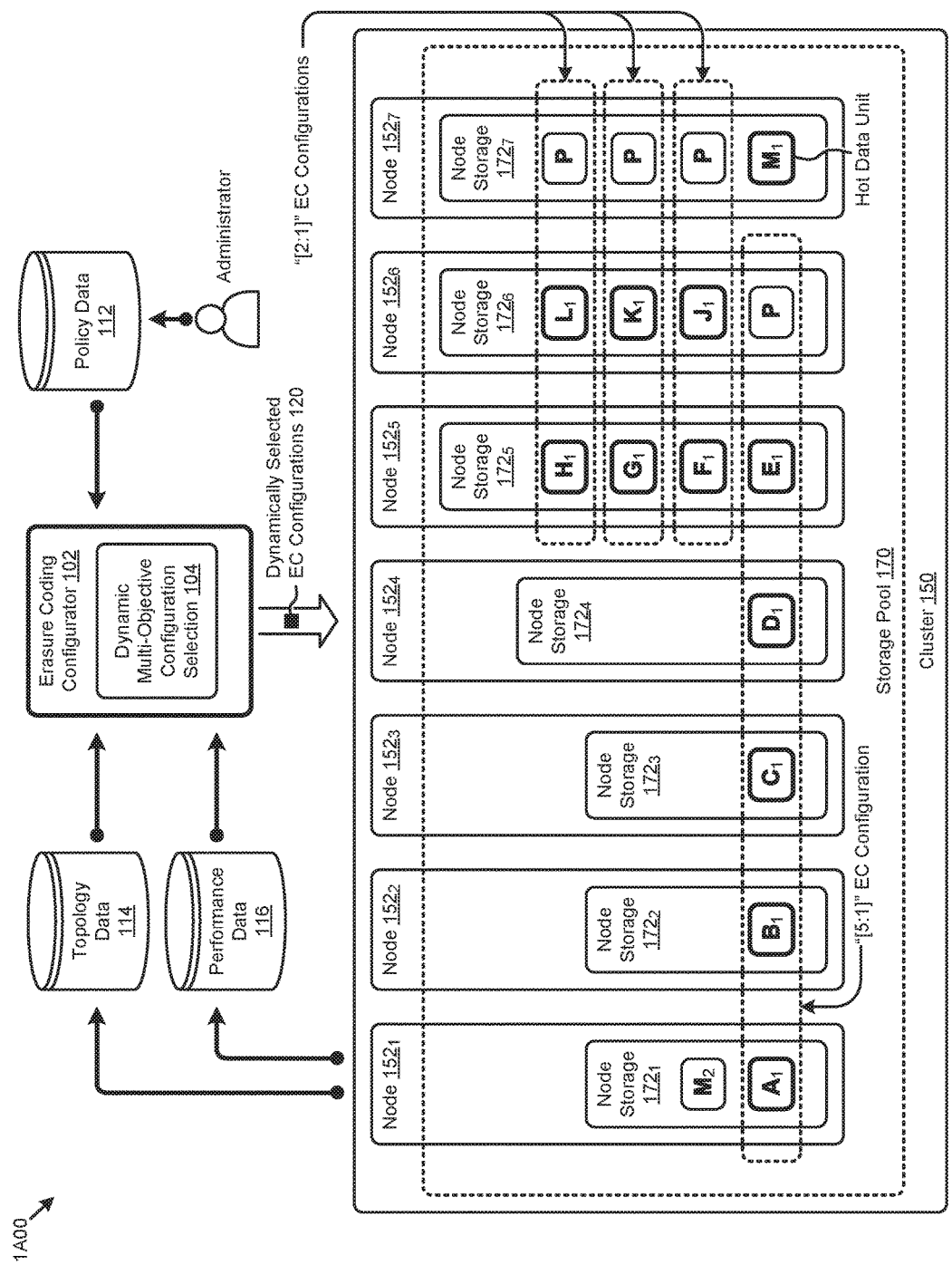
FIG. 1A presents a dynamic EC configuration selection technique as used in a highly dynamic heterogeneous distributed computing environment, according to an embodiment.

Embodiments in accordance with the present disclosure address the problem of efficiently implementing erasure coding in heterogeneous computing and storage systems. Some embodiments are directed to approaches for implementing a multi-objective selection technique to dynamically select erasure coding configurations in heterogeneous computing and storage systems. The accompanying figures and discussions herein present example environments, systems, methods, and computer program products.

OVERVIEW

Disclosed herein are techniques for implementing a multi-objective selection technique to dynamically select erasure coding configurations in heterogeneous computing and storage systems. In certain embodiments, an erasure coding configurator accesses various information characterizing specified fault tolerance policies pertaining to the data managed by the system. The configurator accesses various platform information pertaining to the distributed system, such as topology characteristics (e.g., node topology, node configuration, availability domain boundaries, etc.) and/or performance characteristics pertaining to uses of the data of the system (e.g., data access patterns, data access latency, etc.). Responsive to a detected erasure coding configuration event (e.g., due to a topology change), the accessed information is used to generate a set of candidate EC configurations that are feasible to be implemented in the system. A configuration score is computed for each candidate EC configuration to facilitate a quantitative comparison of the candidate EC configurations with respect to certain objectives.

For example, such configuration scores might describe a quantitative relationship with a storage space savings objective and/or a performance objective, subject to certain fault tolerance and/or topology (e.g., availability domain) constraints. The candidate EC configuration or configurations with the best performance in relation to the objectives (e.g., the highest configuration scores) are selected for deployment.

In certain embodiments, multiple EC configurations can be implemented concurrently on respective sets of data across various availability domains. An availability domain (e.g., a fault domain), refers to a set of hardware components (e.g., computers, switches, etc.) that share a common point of failure. As an example, an availability domain might be bounded by a physical server or a rack of servers. In some cases, the availability domain might be a portion of a server rack, where merely certain support components (e.g., redundant power supply unit, fans, etc.) are shared with other availability domains comprising the server rack. A particular topology of a computing system might deploy several computing nodes in a single availability domain. Or, a particular topology of a computing system might deploy a heterogeneous combination of one or more compute-centric nodes together with one or more storage-centric nodes a particular availability domain.

In certain embodiments, responsive to a change in the boundary of an availability domain and/or responsive to a change in the topological mapping of nodes into availability domains, earlier implemented EC configurations are converted to newly selected EC configurations. In certain embodiments, the erasure coding configuration event is dynamically triggered by system performance measurements. In some embodiments, the erasure coding configuration event is invoked by occurrence of any sort of topology change (e.g., a node failure, a node addition, a storage device failure, a storage device addition, etc.). In still other embodiments, the erasure coding configuration event is invoked in response to certain actions taken at a user interface (e.g., an explicit update command, a policy change, an explicit topology change, etc.).

DEFINITIONS AND USE OF FIGURES

Some of the terms used in this description are defined below for easy reference. The presented terms and their respective definitions are not rigidly restricted to these definitions—a term may be further defined by the term's use within this disclosure. The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances. As used herein, at least one of A or B means at least one of A, or at least one of B, or at least one of both A and B. In other words, this phrase is disjunctive. The articles "a" and "an" as used in this application and the appended claims should generally be construed to mean "one or more" unless specified otherwise or is clear from the context to be directed to a singular form.

As used herein, an availability domain is defined by a boundary around certain hardware elements of a computing system. Strictly as one example, an EC configuration might involve two or more availability domains, where subject data is stored in a device of a first availability domain that is powered by a first power source, and where another occurrence of the subject data or its corresponding parity data is stored in a device of a second availability domain that is powered by a second power source. As such, even if a single one of the two power sources fails, there remains another accessible occurrence of the subject data or its corresponding parity data. When generating erasure coding configurations, one criteria used in selection of where to locate occurrences of subject data and it corresponding parity data is to locate the occurrences in locations that are not likely to fail for the same reason. The granularity of an availability domain can be different for different computing systems and/or topologies. Continuing the foregoing example, rather than referring to different power sources, an availability domain might refer to different motherboards, or to different drawers of a rack, or different racks, etc. Moreover, a specific type or granularity of availability domain might refer to a hardware boundary in its name. As examples, a configuration might pertain to a "rack domain" when referring to an availability domain that is bounded by a rack, or a configuration might pertain to a "motherboard domain" when referring to an availability domain that is bounded by a motherboard, or a configuration might pertain to a "block domain" when referring to an availability domain that is bounded by any particular block or partitioning of hardware and/or software.

Various embodiments are described herein with reference to the figures. It should be noted that the figures are not necessarily drawn to scale and that elements of similar structures or functions are sometimes represented by like reference characters throughout the figures. It should also be noted that the figures are only intended to facilitate the description of the disclosed embodiments—they are not representative of an exhaustive treatment of all possible embodiments, and they are not intended to impute any limitation as to the scope of the claims. In addition, an illustrated embodiment need not portray all aspects or advantages of usage in any particular environment.

An aspect or an advantage described in conjunction with a particular embodiment is not necessarily limited to that embodiment and can be practiced in any other embodiments even if not so illustrated. References throughout this specification to "some embodiments" or "other embodiments" refer to a particular feature, structure, material or characteristic described in connection with the embodiments as being included in at least one embodiment. Thus, the appearance of the phrases "in some embodiments" or "in other embodiments" in various places throughout this specification are not necessarily referring to the same embodiment or embodiments. The disclosed embodiments are not intended to be limiting of the claims.

Descriptions of Example Embodiments

FIG. 1A presents a dynamic EC configuration selection technique 1A00 as used in a highly dynamic heterogeneous distributed computing environment. As an option, one or more variations of dynamic EC configuration selection technique 1A00 or any aspect thereof may be implemented in the context of the architecture and functionality of the embodiments described herein.

As earlier mentioned, techniques that rely on administrative prowess are inflexible in that administrators often apply a single erasure coding configuration across an entire computing system. For example, a "[5:1]" EC configuration might be implemented in a multi-node computing system to achieve a fault tolerance (FT) of "1" (e.g., one point of failure is tolerated). In "[5:1]" EC configurations, a strip of five data blocks across five separate nodes are encoded to form one parity block in the context of a sixth node. While such an EC configuration serves the purpose of fault tolerance with FT=1, such static and inflexible configuration techniques are deficient for use in systems comprising computing nodes having different configurations.

One such example configuration is depicted in FIG. 1A. The shown computing system has a set of seven computing nodes that includes three larger capacity (e.g., 4 TB) storage-centric nodes and four smaller capacity (e.g., 1 TB) compute-centric nodes. Due to the differences in size, the possible EC configurations are limited. This is because, for many EC configurations, large portions of the data in the 4 T capacity nodes would not be able to be paired with enough storage space at the 1 T nodes. In order to comply with a fault tolerance requirement, data would need to be replicated rather than seizing the benefits of erasure coding. While replication of data can be used to achieve fault tolerance, it misses out on the opportunity for storage capacity savings that might be achieved by implementing erasure coding rather than incurring the storage expense of replicating data. At the same time, the characteristics of the shown computing system that has the aforementioned three larger capacity storage-centric nodes and the aforementioned four smaller capacity compute-centric nodes could be configured for more space-efficient deployment of EC code, if two EC configurations were able to be supported.

Before deploying any EC configuration to a computing system, topology characteristics (e.g., node configurations), performance characteristics (e.g., system performance) and policy characteristics (e.g., fault tolerance policies) have to be considered in totality, even in the face of changes in any of the topology, and/or performance demands, and/or policy changes. FIG. 1 depicts a dynamic EC configuration selection technique as an example embodiment for implementing dynamically selected erasure code configurations. Specifically, FIG. 1A depicts a computing system (e.g., cluster 150) comprised of multiple heterogeneous nodes (e.g., node $152_1$, node $152_2$, node $152_3$, node $152_4$, node $152_5$, node $152_6$, and node 152$_7$). As illustrated, the nodes are heterogeneous, at least as pertains to the capacity size of the local node storage (e.g., node storage 172$_1$, node storage 172$_2$, node storage 172$_3$, node storage 172$_4$, node storage 172$_5$, node storage 172$_6$, and node storage 172$_7$) that comprises a storage pool 170 in cluster 150. As discussed herein, heterogeneous nodes are two or more computing nodes that have different configuration characteristics (e.g., different storage capacities) and/or different deployment characteristics (e.g., for handling particular classes or types of workloads such as storage-centric workloads or compute-centric workloads). Such heterogeneous nodes can be amalgamated into a cluster. In particular, and as depicted in FIG. 1A, the shown computing nodes of cluster 150 can each access a shared storage pool 170. In this embodiment, the storage pool is a logical arrangement of some or all of the storage devices at individual nodes into one logical storage area that is organized as a single series of contiguous logical blocks. Logical block access to the storage pool by any individual node is logically identical to logical block access from any other node. Furthermore, the shown computing nodes can each host a respective instance of a storage controller that accesses the aforementioned shared storage pool. As such, any node can operate (e.g., READ, WRITE, etc.) over any data at any physical storage device (e.g., local storage devices, networked storage devices, etc.) that forms the logical storage pool. Further details pertaining to computing clusters and Further details pertaining storage pools are given below in the discussions of FIG. 7A, FIG. 7B, FIG. 9A, FIG. 9B, and FIG. 9C, as well as in other places infra. The foregoing and subsequent discussions pertaining to clusters and storage pools are non-limiting, and are provided merely for illustration. In particular, the disclosed techniques and configurations can be practiced in many different computing environments, including in computing environment that do not comport with the metes and bounds of a computing cluster. In fact, using the disclosed techniques, multiple EC configurations can be applied not only across multiple nodes of a cluster, but also across multiple storage devices within a node. In some cases, depending on the constraints of fault policies and/or the granularity of availability domains, multiple EC configurations can be applied across multiple storage areas however they may be partitioned.

According to the herein disclosed techniques, efficient erasure coding across such a set of heterogeneous nodes can be achieved by implementing an erasure coding configurator 102 to facilitate a dynamic multi-objective configuration selection 104 of erasure coding configurations to implement in the cluster. As shown in the embodiment of FIG. 1A, erasure coding configurator 102 accesses a set of policy data 112 characterizing fault tolerance policies pertaining to the data in storage pool 170 (e.g., data unit A$_1$ through data unit H$_1$, and data unit J$_1$ through data unit M$_1$). A data unit is any bounding of a storage area. For example, a data unit might be a storage device partition, or might be a storage device track or sector or collection of blocks, or might be a file, or might be an allocated area that is only partially populated, etc.

The erasure coding configurator 102 also accesses instances of topology data 114 describing certain cluster topology characteristics (e.g., node topology, node configuration, etc.), instances of performance data 116 describing certain cluster performance characteristics (e.g., access patterns, access latency, etc.), and/or other data, some of which might derive from administrator input.

At certain moments in time, a set of dynamically selected EC configurations 120 are generated by erasure coding configurator 102 based on various constraints and/or objectives derived from the aforementioned data sources. For example, and as shown, three instances of a "[2:1]" EC configuration and one instance of a "[5:1]" EC configuration might be implemented in storage pool 170. Specifically, the "[2:1]" configurations comprise a "strip" of two data units (e.g., data blocks) and a parity unit (e.g., parity block). The "[5:1]" configuration comprises five data units and a parity unit. More generally, an EC configuration designated as an "[N:K]" EC configuration refers to "N" data units and "K" parity units, where the "N" data units and the "K" parity units are implemented in different/distinct availability domains (e.g., nodes, blocks, hosts, sites, appliances, racks, data centers, etc.). For fault tolerance purposes, an "[N:K]" EC configuration uses a minimum of "N+2K" availability domains.

In some cases, such as for "hot" data units (e.g., M$_1$), no erasure coding might be implemented. Having no erasure coding accommodates a high rate of data unit accesses (e.g., random writes) without incurring the cost of updating the erasure coding parity unit at each write. In such cases, a data replication scheme with a corresponding replication factor (RF) is applied to comply with a fault tolerance (FT) constraint. The replication factor and the fault tolerance are related by RF=FT+1. For example, hot data unit M$_1$ has two replicas (e.g., M$_1$ and M$_2$) across two availability domains (e.g., node 152$_7$ and node 152$_1$) to accommodate a fault tolerance of one (e.g., FT=1) and a corresponding replication factor of two (e.g., RF=2).

Figure 1B:
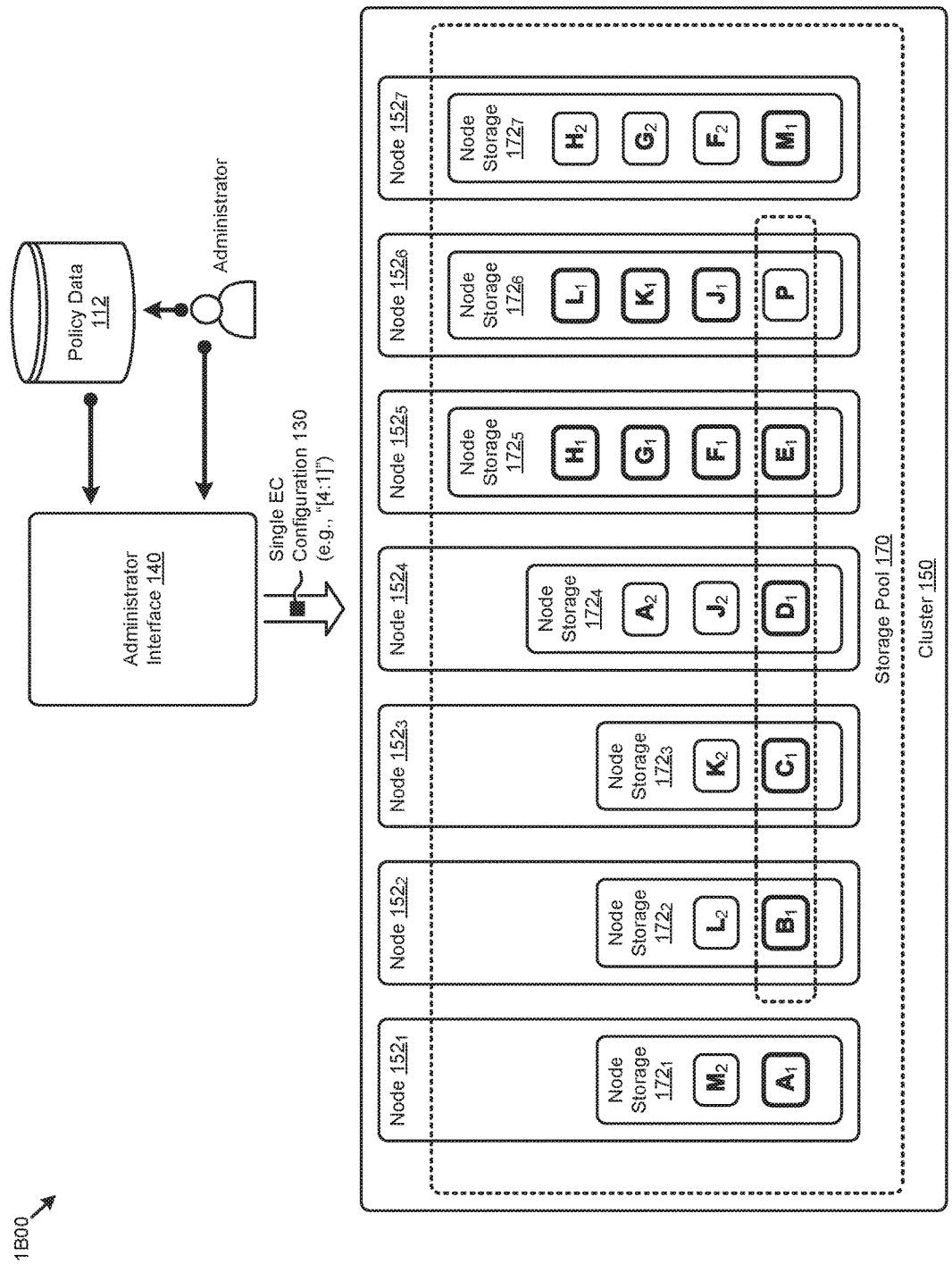
FIG. 1B presents a fixed EC configuration implementation technique as used in a highly dynamic heterogeneous distributed computing environment.

To contrast with the space-efficient multi-EC configuration of FIG. 1A, FIG. 1B depicts the effects of lost opportunities for space-saving efficiency if, for example, an administrator chose to implement a single EC configuration in the same computing system of FIG. 1A. Specifically, FIG. 1B highlights sub-optimal space-saving results when implementing a single "[4:1]" EC configuration under a fault tolerance policy to rebuild data in the event of a single failure.

FIG. 1B presents a fixed EC configuration implementation technique 1B00 as used in a highly dynamic heterogeneous distributed computing environment. As shown, a single EC configuration 130 (e.g., "[4:1]" EC configuration) might be specified at some moment in time at an administrator interface 140 for implementation in cluster 150.

For example, an administrator might specify the single EC configuration 130 at administrator interface 140 based on policy data 112 (e.g., a published fault tolerance value). As can be observed, implementing the single EC configuration 130 (e.g., "[4:1]" EC configuration) across the earlier described heterogeneous nodes (e.g., node 152$_1$, node 152$_2$, node 152$_3$, node 152$_4$, node 152$_5$, node 152$_6$, and node 152$_7$) of cluster 150 results in merely one opportunity to implement erasure coding (e.g., the strip comprising B$_1$ through E$_1$). As such, the fixed "[4:1]" EC configuration fails to seize an opportunity to create a larger strip (e.g., including data unit A$_1$ at node storage 172$_1$). With merely one erasure coding strip implemented, the other data units in the node storage (e.g., node storage 172$_1$, node storage 172$_2$, node storage 172$_3$, node storage 172$_4$, node storage 172$_5$, node storage 172$_6$, and node storage 172$_7$) of storage pool 170 are replicated (e.g., without the space-saving gains of erasure coding) so as to satisfy the fault tolerance settings. The result is poor storage space savings in the storage pool due to the naively-implemented fixed erasure coding configuration. Scenarios involving handling cluster reconfiguration events as well as administrative events so as to achieve improved storage space utilization are shown and discussed as pertains to the appended figures.

Figure 1C:
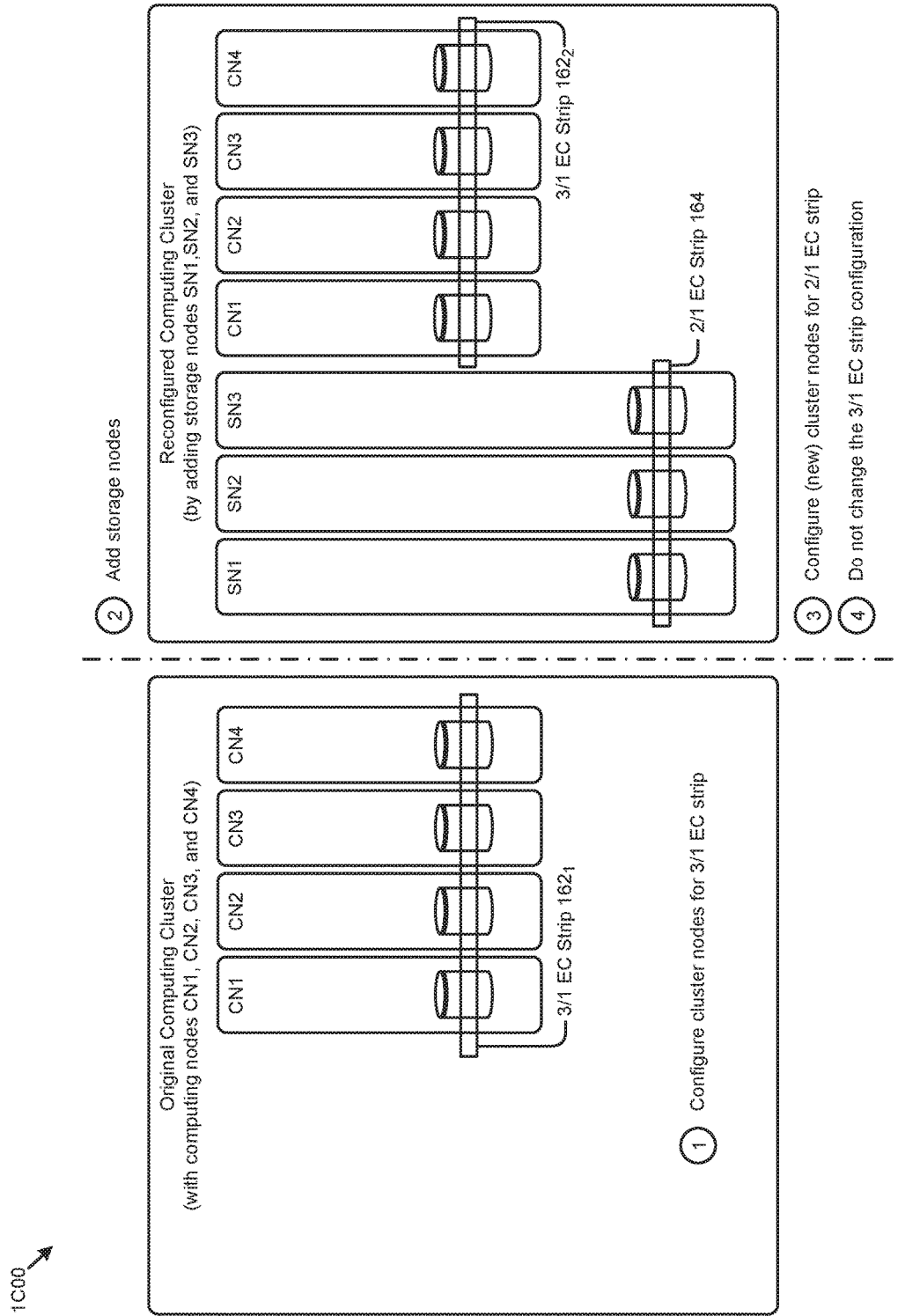
FIG. 1C depicts a cluster reconfiguration scenario that employs dynamic reconfiguration of fault tolerant erasure coding strips, according to an embodiment.

FIG. 1C depicts a cluster reconfiguration scenario 1C00 that employs dynamic reconfiguration of fault tolerant erasure coding strips. As an option, one or more variations of cluster reconfiguration scenario 1C00 or any aspect thereof may be implemented in the context of the architecture and functionality of the embodiments described herein. The cluster reconfiguration scenario 1C00 or any aspect thereof may be implemented in any environment.

The embodiment shown in FIG. 1C is merely one example. As shown, the cluster reconfiguration scenario performs dynamic configuration of the fault tolerance (FT) such that the reconfigured cluster supports two different FT/EC configurations that are determined based on the makeup (e.g., heterogeneity) of the augmented cluster.

Initially, the cluster is configured with a "3/1 EC strip" $162_1$ (operation 1). Upon adding one or more storage nodes (operation 2), the "2/1 EC Strip" 164, is added (operation 3) while retaining the previously used "3/1 EC strip" $162_2$ configuration (operation 4). The foregoing is merely one example of a reconfiguration scenario. Other scenarios arise upon events when different types of nodes (e.g., nodes of particular configurations that differ from the configuration of the already installed nodes) are added (e.g., due to an augmentation of the cluster) and/or removed (e.g., due to a failed and/or out-of-service condition of a node or nodes), and/or when a node or nodes are replaced by upgraded nodes.

Further details regarding general approaches to managing erasure coding are described in U.S. Pat. No. 9,672,106 titled, "ARCHITECTURE FOR IMPLEMENTING ERASURE CODING" issued on Jun. 6, 2017, which is hereby incorporated by reference in its entirety.

Figure 2A:
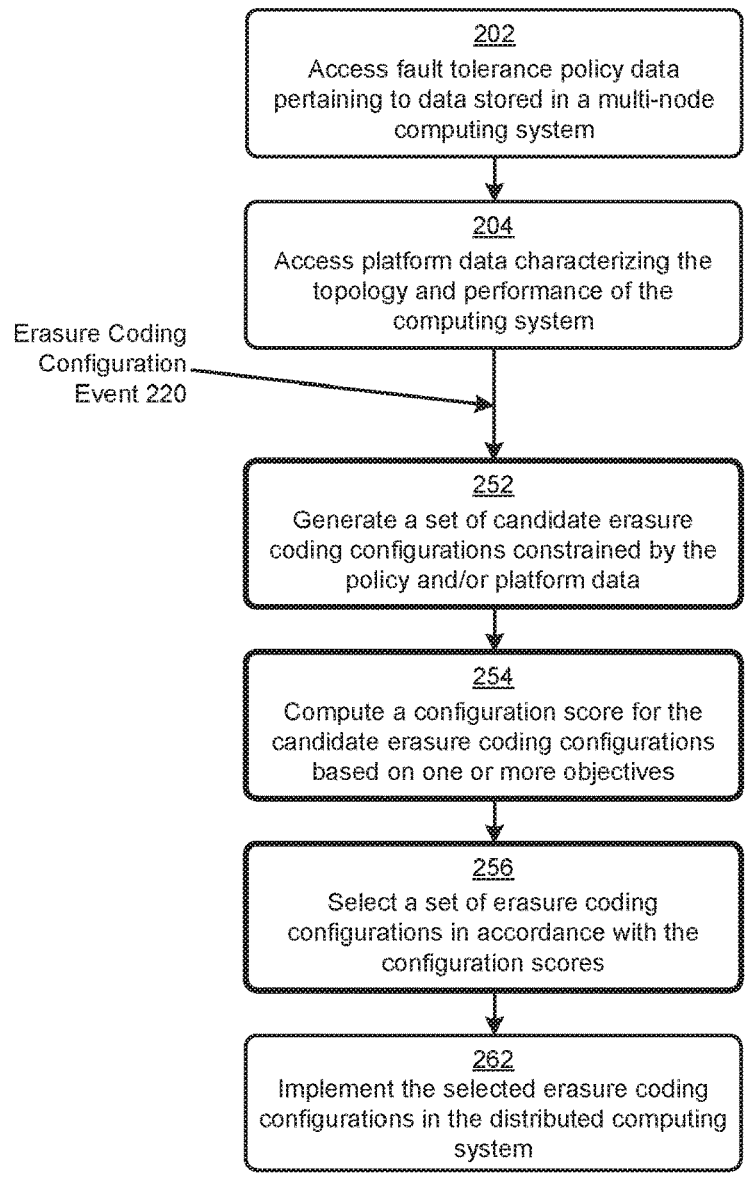
FIG. 2A depicts an erasure coding configuration technique as implemented in systems that facilitate dynamically configurable erasure coding in heterogenous computing and storage environments, according to an embodiment.

FIG. 2A depicts an erasure coding configuration technique 2A00 as implemented in systems that facilitate dynamically configurable erasure coding in heterogenous computing and storage environments. As an option, one or more variations of erasure coding configuration technique 2A00 or any aspect thereof may be implemented in the context of the architecture and functionality of the embodiments described herein. The erasure coding configuration technique 2A00 or any aspect thereof may be implemented in any environment.

The erasure coding configuration technique 2A00 presents one embodiment of certain steps and/or operations that facilitate dynamically configurable erasure coding in heterogenous computing and storage environments. As illustrated, the erasure coding configuration technique 2A00 can commence by accessing a set of fault tolerance policy data pertaining to a set of data stored in a distributed computing system (step 202). For example, such policy data might be specified by the owner and/or user of the data or representative thereof (e.g., an enterprise, system administrator, etc.) based on a service level agreement (SLA) with the distributed computing system manager and/or provider. A set of platform data characterizing the topology and/or performance of the distributed system is also accessed (step 204). As an example, certain topology characteristics (e.g., node topology, node configuration, availability domain boundaries, etc.) and/or performance characteristics (e.g., access patterns, access latency, etc.) that are monitored internally by the system might be accessed.

At some moment in time, an erasure coding configuration event 220 might occur. Such an event might be triggered by an administrator to establish an initial EC configuration or, such an event might be triggered by any sort of change in the computing system. For example, an erasure coding update might be invoked by a topology change (e.g., one or more nodes are added or removed) and/or a change in some performance measurement (e.g., storage I/O activity is increased or decreased). As another example, an erasure coding configuration event might be triggered by a user input (e.g., clicking an "Update" button at a user interface) and/or a policy change, such as an enterprise-level change to an SLA that includes a change to a fault tolerance value.

Responsive to a detected erasure coding configuration event, a set of candidate erasure coding configurations are generated subject to any constraints derived from the accessed data (step 252). For example, a fault tolerance value of FT=1 constrains the candidate erasure coding configurations to "[*:1]" EC configurations (or no erasure coding). A configuration score for each of the candidate erasure coding configurations is then computed and considered with respect to one or more objectives (step 254).

In some cases, the objectives and/or functions that quantify achievement of an objective might be specified and/or derived from the policy data. For example, an enterprise might indicate in an SLA that erasure coding implementations are to trade off storage space savings with an access latency degradation according to some objective function. In other cases, the distributed system provider might identify the objectives and any corresponding objective functions based on historical resource usage measurements.

In some cases, an objective and/or its weighting and/or a mechanism for determining a particular value from a set of inputs can be codified into a data structure having a tabular form. One example of such a data structure is given in Table 1. Using such a table, a performance metric can be determined from, or as a function of N, where N is the number of data units in an EC configuration.

TABLE 1

Performance as a function of N

| Input value of N (N = number of data units in the EC Configuration) | Relative performance metric value |
|---|---|
| 1 | 8 |
| 2 | 4 |
| 4 | 2 |

Table 1 shows a relative performance metric of 8 being accorded when N=1. This reflects the effect that only no additional data units need to be accessed when calculating parity. However, when N=2 the stored values at the first data unit as well as the stored values of the second data unit need to be accessed in order to calculate parity, thus being accorded a relative performance metric of 4. When N=4 the stored values at the first data unit as well as the stored values of the second data unit, as well as the stored values of the third data unit as well as the stored values of the fourth data unit need to be accessed in order to calculate parity, thus requiring twice as many accesses as when N=4, and thus being accorded a relative performance metric of 2. A performance metric is merely one variable used in calculating a configuration score. Other metrics, objectives and constraints be used in calculating a configuration score and/or testing for feasibility.

The configuration score facilitates a quantitative comparison of the candidate EC configurations with respect to the quantified values and objectives. For example, a performance metric can be represented as a quantity P, and a storage savings can be represented as a quantity S, and so on. The quantities can be related in an equation. For example, a configuration score might be described as sum of weighted values. A storage space savings quantity and/or an access latency or other performance quantities can be weighted and added to form a configuration score. Multiple configuration scores corresponding to respective EC configurations can be subjected to fault tolerance and/or topology (e.g., availability domain) constraints to identify feasible/infeasible configurations.

Strictly as examples, a configuration score can have forms such as are given in EQ. 1 or EQ. 2:

$$CS=W_1N+W_2K+W_3P(N,K)+W_4S(N,K) \quad \text{(EQ. 1)}$$

$$CS=W_5P(N,K)+W_6S(N,K) \quad \text{(EQ. 2)}$$

where:
CS=the configuration score value, and
N=number of data units (e.g., nodes), and
K=number of parity units (e.g., nodes), and
P=a performance metric as a function of N and K, and
S=a storage space saving metric as a function of N and K, and where
$W_1$, $W_2$, $W_3$, $W_4$, $W_5$, and $W_6$ are weighting coefficients.

The foregoing equations are merely examples. Other scoring techniques involve multiplication of terms (e.g., $CS=W_5P(N,K) \times W_6S(N,K)$), and/or use of ratios, and/or use of exponents, and/or normalization of quantities, and/or any other mathematical or other manipulations of quantities that result in absolute or relative scores for candidate erasure coding configurations.

After at least some of the candidate erasure coding configurations are scored, one or more of the candidate erasure coding configurations are selected in accordance with their respective configuration scores (step 256) for implementation in the distributed computing system (step 262). For example, in large heterogeneous clusters, multiple high scoring EC configurations of varying strip sizes might be selected for implementation in groups of like-sized availability domains.

An event that raises a signal to initiate reconfiguration can happen at any time. Reconfiguration can be accomplished in many way, one of which is shown and discussed as pertains to FIG. 2B.

Figure 2B:
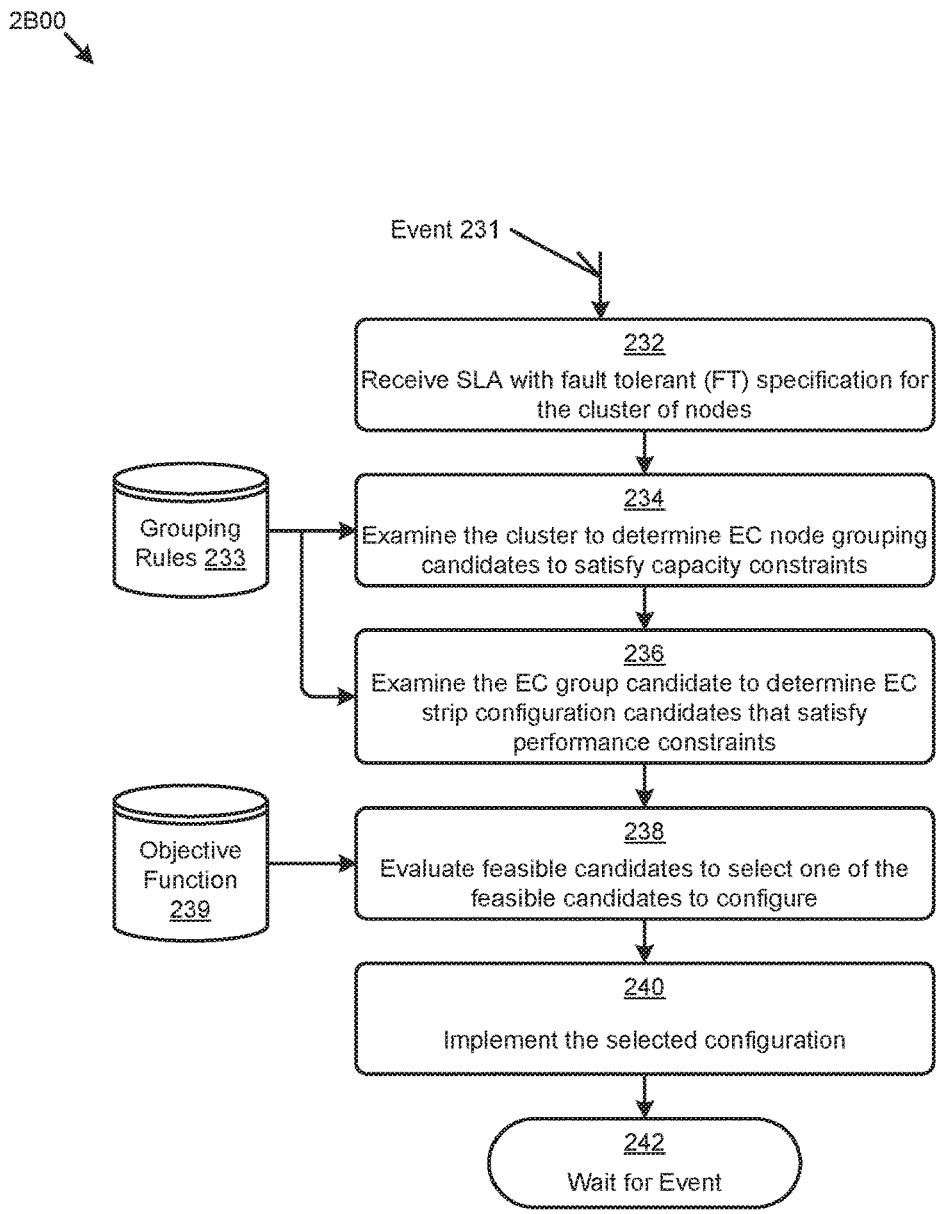
FIG. 2B is a flowchart showing a dynamic heterogeneous cluster reconfiguration technique that employs event-driven dynamic reconfiguration of fault tolerant erasure coding strips, according to an embodiment.

FIG. 2B is a flowchart showing a dynamic heterogeneous cluster reconfiguration technique 2B00 that employs event-driven dynamic reconfiguration of fault tolerant erasure coding strips. As an option, one or more variations of dynamic heterogeneous cluster reconfiguration technique 2B00 or any aspect thereof may be implemented in the context of the architecture and functionality of the embodiments described herein. The dynamic heterogeneous cluster reconfiguration technique 2B00 or any aspect thereof may be implemented in any environment.

The embodiment shown in FIG. 2B is merely one example. As shown, the dynamic heterogeneous cluster reconfiguration technique commences upon detection of an event 231. The then-current service level agreement (SLA) is consulted (step 232) to determine the fault tolerance specification. Using a set of grouping rules 233, the cluster constituency is examined (step 234) so as to determine node grouping possibilities. The grouping rules are further used by step 236 to examine the node grouping possibilities as those grouping pertain to performance considerations and/or performance constraints (e.g., which might be codified in the SLA). In some cases, there are many grouping variations that satisfy (1) the capacity constraints/limits, (2) the performance constraints/limits, and (3) the fault tolerance of the cluster as a whole. In such situations, multiple feasible candidates are considered and at least one such feasible candidate is selected for implementation over the cluster (step 240). In some situations, the at least one such feasible candidate is selected based on an objective function 239.

Having concluded the implementation (e.g., grouping, striping, metadata initialization, etc.), the processing pends, awaiting a next event. The aforementioned configuration of strips can involve local storage (e.g., local storage per node), and/or remote storage (e.g., NAS/SAN). Strip elements can be composed of extents or extent groups, or any boundary that can be defined in a metadata data structure.

Figure 3:
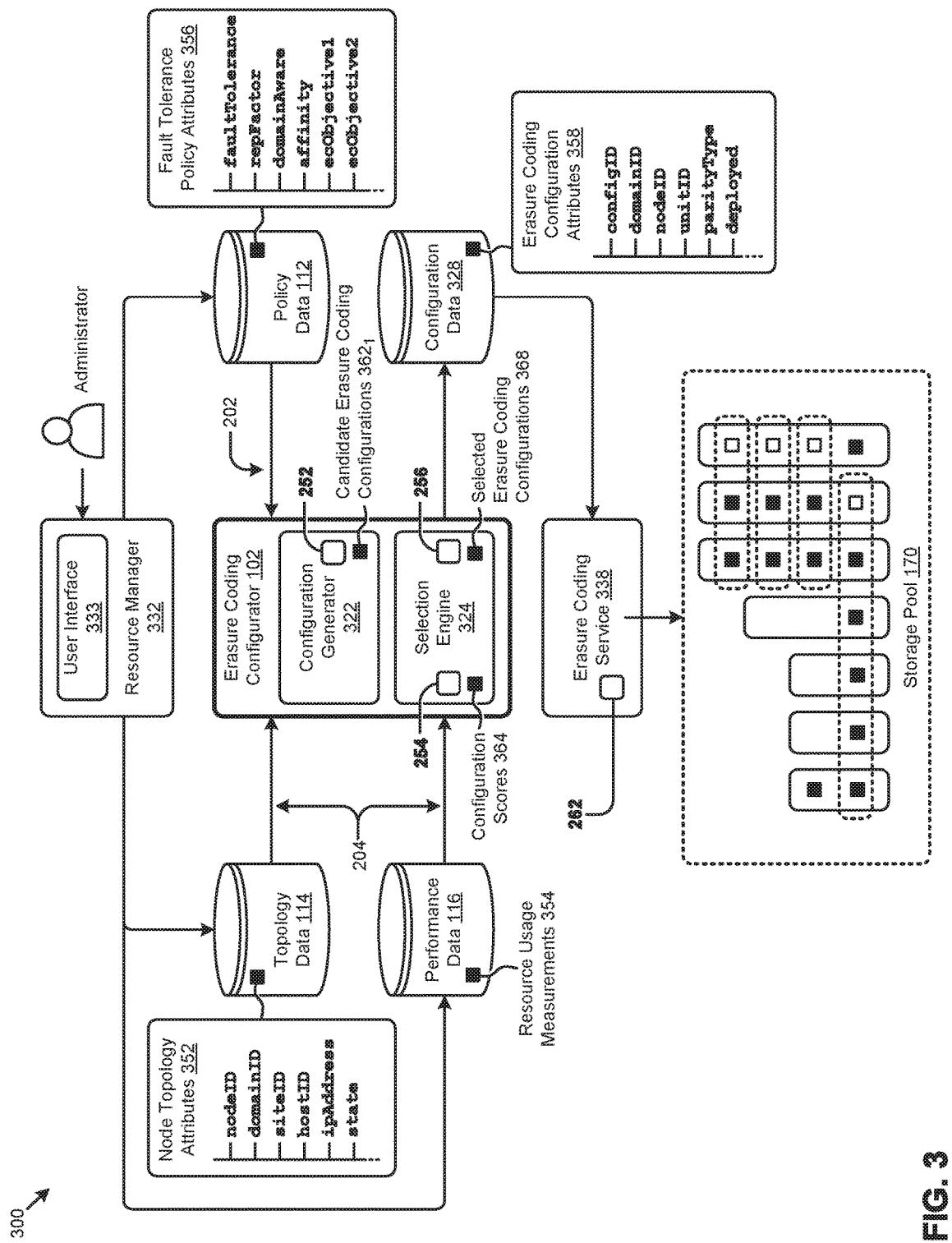
FIG. 3 depicts a computing environment in which embodiments of the present disclosure can be implemented.

A computing environment for implementing any of the herein disclosed techniques is shown and described as pertains to FIG. 3.

FIG. 3 depicts a computing environment 300 in which embodiments of the present disclosure can be implemented. As an option, one or more variations of computing environment 300 or any aspect thereof may be implemented in the context of the architecture and functionality of the embodiments described herein.

As shown in FIG. 3, the erasure coding configurator 102 earlier described can interact with various components in computing environment 300 (e.g., distributed computing environment) to implement dynamically configurable erasure coding in a heterogenous computing and storage environment represented by storage pool 170. Certain specialized data structures that are designed to improve the way a computer stores and retrieves data in memory when performing such techniques are also shown.

Specifically, the erasure coding configurator 102 might interact with various data provided by a resource manager 332. In some cases, instances of resource manager 332 might run on one or more nodes in a cluster with an elected leader instance. Resource manager 332 can provide certain instances of topology data 114 and/or instances of policy data 112 and/or instances of performance data 116, that can be accessed by erasure coding configurator 102.

As an example, resource manager 332 can continually monitor the nodes associated with storage pool 170 to detect changes to the node topology such as added nodes, removed nodes, failed nodes, availability domain boundary shifts, and/or other topology characteristics. Resource manager 332 can further monitor the resources (e.g., computing resource, storage resources, networking resources, etc.) associated with storage pool 170 to collect various instances of resource usage measurements 354 at certain time intervals to indicate the historical performance (e.g., data access latency, storage capacity utilization, etc.) of the resources. Resource manager 332 can further continually update policy data 112 based at least in part on user (e.g., administrator) interactions with a user interface 333, an enterprise policy file, and/or other policy data sources.

Information about the then-current node topology can be codified in the topology data 114. The topology data 114 are often organized and/or stored in a tabular structure (e.g., relational database table) having rows corresponding to a particular node and columns corresponding to various attributes pertaining to that node. For example, as depicted in node topology attributes 352, a table row might describe a node identifier or "nodeID", an availability domain identifier or "domainID", a site identifier or "siteID", host identifier or "hostID", an IP address or "ipAddress", a node state or "state" (e.g., pertaining to node health, loading, etc.), and/or other attributes.

Further, policy data 112 might store (e.g., in a relational database table) certain information pertaining to a set of fault tolerance policy attributes 356 derived from various policy information sources (e.g., enterprise policy file, user-specified policy settings, etc.). As shown, the fault tolerance policy attributes 356 might describe a fault tolerance value or "faultTolerance", a replication factor or "repFactor", a Boolean availability domain awareness setting or "domainAware" setting (e.g., "on" or "off"), node affinity or "affinity" node list, a first erasure coding objective or "ecobjective1", a second erasure coding objective or "ecObjective2", and/or other attributes.

When an erasure coding configuration event is detected, a configuration generator 322 at erasure coding configurator 102 accesses policy data 112 (step 202), as well as topology data 114 (step 204), and/or performance data 116 (step 204) to generate one or more instances of candidate erasure coding configurations $362_1$ (step 252). Further details pertaining to techniques for generating the candidate erasure coding configurations $362_1$ are described herein. A selection engine 324 at erasure coding configurator 102 can compute a set of configuration scores 364 for the candidate erasure coding configurations $362_1$ to facilitate comparison of the configurations in an objective space derived from at least some of the collected topology data, performance data, and/or policy data (e.g., "ecobjective1", "ecObjective2", etc.) (step 254). In some cases, selection engine 324 can select a one or more of the candidate erasure coding configurations (e.g., selected erasure coding configurations 368) based on configuration scores 364 and/or any other information collected from the data sources available to erasure coding configurator 102 (step 256). Further details pertaining to techniques for selecting the selected erasure coding configurations from the candidate erasure coding configurations $362_1$ are also described herein.

The selected erasure coding configurations 368 selected by selection engine 324 can be stored in a set of configuration data 328 for access by an erasure coding service 338. In some embodiments, distributed instances of the erasure coding service 338 might execute on each node of a cluster, where any one or more of the distributed instances are able to manage all or parts of the actions taken to implement the selected erasure coding configurations 368 across storage pool 170 (step 262). In some embodiments, a centralized erasure coding service 338 can run on a leader node in a cluster so as to manage the implementation of the selected erasure coding configurations 368.

Configuration data 328 that describes the selected erasure coding configurations 368 are often organized and/or stored in a tabular structure (e.g., relational database table) having rows corresponding to a particular configuration from selected erasure coding configurations 368 and columns corresponding to various attributes pertaining to that configuration. For example, and as depicted in erasure coding configuration attributes 358, a table row might describe a configuration identifier or "configID", an availability domain identifier or "domainID" (e.g., of a particular availability domain in the configuration strip), a node identifier or "node ID" (e.g., of a particular node in the configuration strip), a data unit identifier or "unitID" (e.g., of a particular data unit in the configuration strip), a configuration parity type or "parityType", a deployment indicator or "deployed" flag (e.g., "yes" or "no"), and/or other attributes. As an example, the "deployed" flag might be used by the erasure coding service 338 to distinguish between earlier deployed EC configurations and newly entered EC configurations (e.g., newly entered EC configurations that are approved for deployment).

The components, data structures, and data flows shown in FIG. 3 present merely one partitioning and associated data manipulation approach. The specific example shown is purely exemplary, and other subsystems and/or partitioning are reasonable. Example candidate erasure coding configurations generated using such components, data structures, data flows, and/or partitionings are shown and described as pertaining to FIG. 4A and FIG. 4B. More specifically, a plurality of erasure coding configurations can be plotted in a multi-dimensional space. Constraints can be applied in the space to divide feasible erasure coding configurations from infeasible erasure coding configurations, after which scoring and/or optimization functions (e.g., using variations of EQ. 1 and/or variations of EQ. 2) can be applied to the feasible set. Such plotting, application of constraints and optimizations are depicted in the diagrams of FIG. 4A and FIG. 4B.

Figures 4A, 4B:
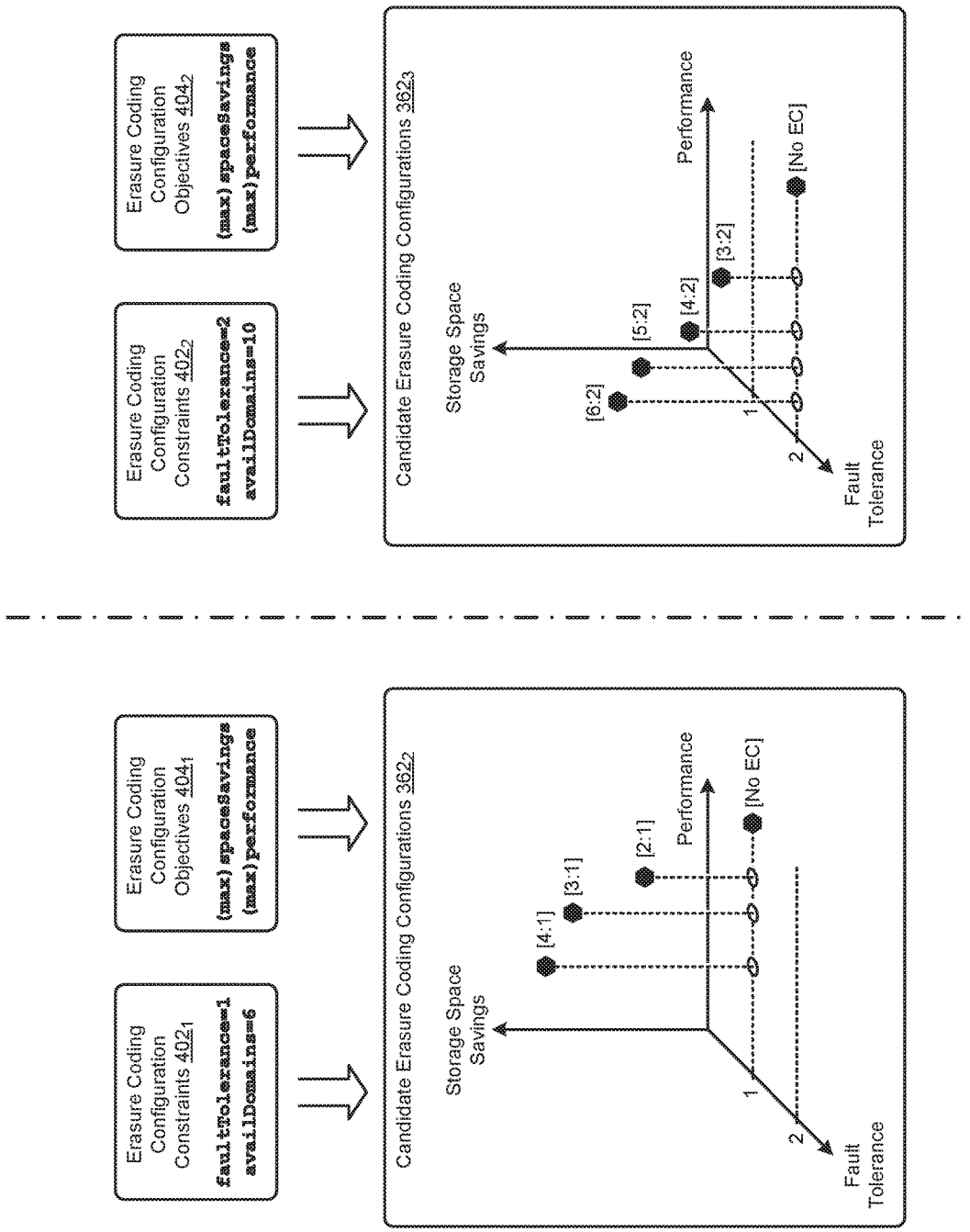
FIG. 4A and FIG. 4B are diagrams showing example EC configuration objective spaces as used in systems that facilitate dynamically configurable erasure coding in heterogenous computing and storage environments, according to an embodiment.

FIG. 4A and FIG. 4B are diagrams showing example EC configuration objective spaces as used in systems that facilitate dynamically configurable erasure coding in heterogenous computing and storage environments. As an option, one or more variations of EC configuration objective spaces or any aspect thereof may be implemented in the context of the architecture and functionality of the embodiments described herein. The EC configuration objective spaces or any aspect thereof may be implemented in any environment.

The candidate erasure coding configurations shown in FIG. 4A are merely examples of erasure coding configurations plotted in certain representative objective spaces. As described herein, one or more instances of such candidate erasure coding configurations can be dynamically generated and selected for implementation to facilitate dynamically configurable erasure coding in heterogenous computing and storage environments. As shown, a first set of candidate erasure coding configurations $362_2$ are derived from a set of erasure coding configuration constraints $402_1$ and a set of erasure coding configuration objectives $404_1$. Erasure coding configuration constraints $402_1$ indicate, for example, a fault tolerance constraint of "faultTolerance=1" and an availability domain count constraint of "availDomains=6". These constraints limit feasible "[N:K]" EC configurations to those for which K=1 and N≤4. Further, erasure coding configuration objectives $404_1$ indicate that one objective is to maximize the erasure coding storage space savings (e.g., "(max)spacesavings") and another objective is to maximize the data access performance in the presence (or absence) of an erasure coding implementation (e.g., "(max)performance").

As can be observed from FIG. 4A, the candidate erasure coding configurations $362_2$ generated from the foregoing constraints are plotted in an objective space defined by a "Fault Tolerance" dimension, a "Storage Space Savings" dimension, and a "Performance" dimension. Specifically, in the plane defined by a fault tolerance of "1" (e.g., derived from "faultTolerance=1"), various candidate EC configurations (e.g., "[2:1]", "[3:1]", and "[4:1]") are shown. A "candidate configuration" representing no erasure coding (e.g., "[No EC]") is also shown. The position of each candidate configuration in the "Storage Space Savings" dimension and the "Performance" dimension is based on a measure of the candidate configuration for one or more metrics corresponding to each dimension. For example, a storage space savings metric might be a percent reduction in storage capacity utilization that results from an implementation of a particular configuration.

A performance metric might be the expected access latency when accessing the data units of a particular configuration. Another performance metric might be derived from measured or calculated update latencies when striping the data units that comprise a particular configuration. In some cases, the expected access latency for the data units in an EC strip might be based on measured historical access patterns. In other cases, the expected access latency for the data units in an EC strip might be based on predicted access patterns. As such, performance measurements and/or predictions pertaining to "hot" data and/or performance measurements and/or predictions pertaining to "cold" data can be combined to predict the performance effects of implementing a particular erasure coding configuration. For example, implementing erasure coding on cold data units might result in a limited impact on overall access latency for the data units, while implementing erasure coding on hot data units might result in a higher impact on overall access latency for the data units.

As another example, and as shown in FIG. 4B, a second set of candidate erasure coding configurations 362₃ are derived from a set of erasure coding configuration constraints 4022 and a set of erasure coding configuration objectives 4042. Erasure coding configuration constraints 4022 indicate a fault tolerance constraint of "faultTolerance=2" and an availability domain count constraint of "availDomains=10". These constraints limit feasible "[N:K]" EC configurations to those for which K=2 and N≤6. Further, the erasure coding configuration objectives 4042 indicate that one objective is to maximize the erasure coding storage space savings (e.g., "(max) spacesavings") and another objective is to maximize the data access performance in the presence (or absence) of an erasure coding implementation (e.g., "(max)performance").

As can be observed from FIG. 4B, various candidate EC configurations (e.g., "[3:2]", "[4:2]", "[5:2]", and "[6:2]") generated from the foregoing constraints are plotted in a plane defined by a fault tolerance of "2" (e.g., derived from "faultTolerance=2"). A "candidate configuration" representing no erasure coding (e.g., "[No EC]") is also shown.

As can be observed, there is a tradeoff between "Performance" and "Storage Space Savings" for candidate erasure coding configurations. This is depicted by candidate erasure coding configurations 362₂ (shown in FIG. 4A) and candidate erasure coding configurations 362₃ (shown in FIG. 4B). In some cases, such as for warm or hot data units, the EC configuration or configurations having the highest performance might be selected for implementation. In other cases, such as for cold data units, the EC configuration or configurations having the highest storage space savings might be selected for implementation. In still other cases, the relative weight of the objectives in the objective space vary dynamically. One technique for selecting EC configurations from a set of candidate EC configurations in an objective space is shown and described as pertaining to FIG. 5.

Figure 5:
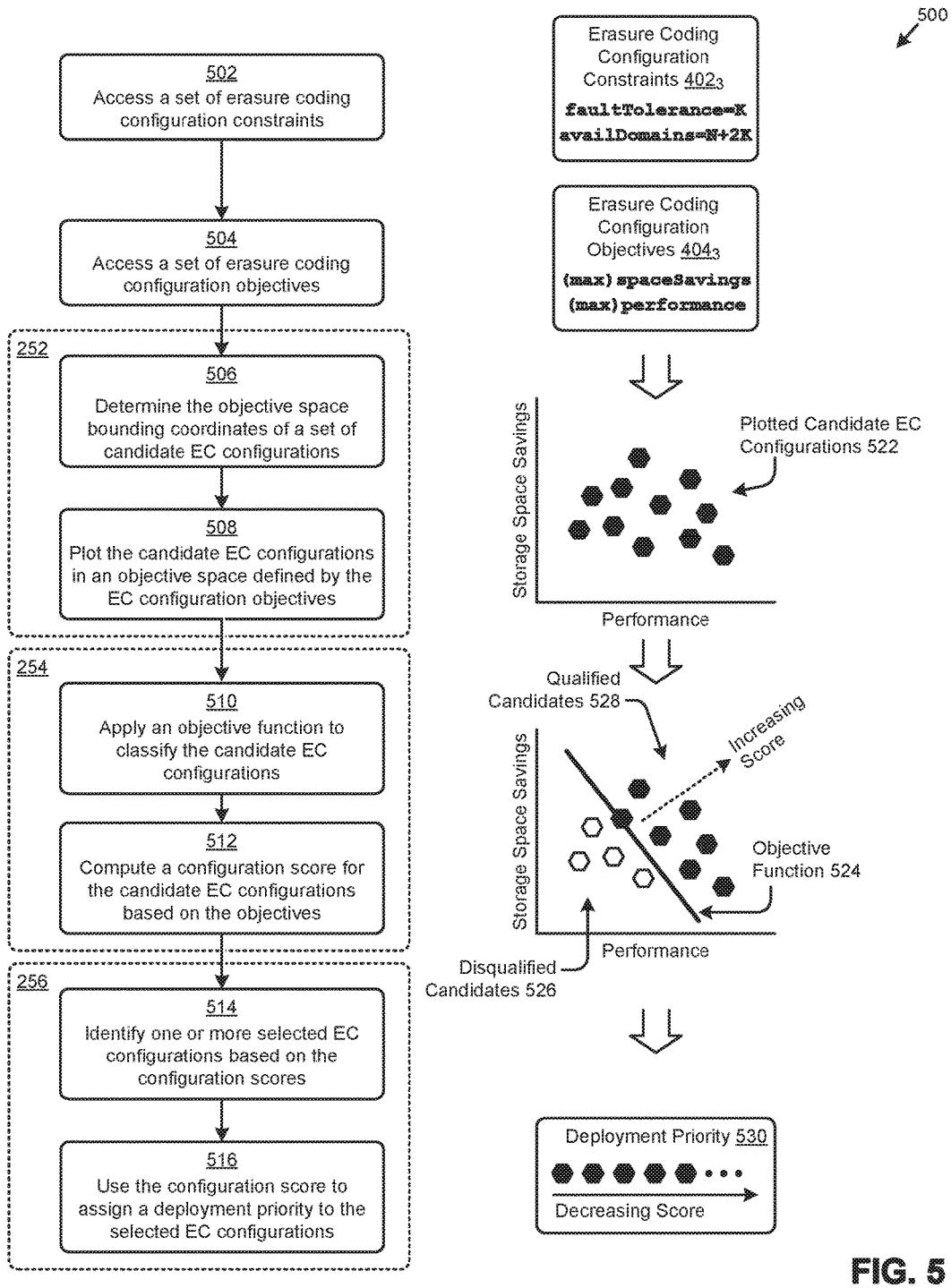
FIG. 5 depicts an EC configuration selection technique as used in systems that facilitate dynamically configurable erasure coding in heterogenous computing and storage environments, according to an embodiment.

FIG. 5 depicts an EC configuration selection technique 500 as used in systems that facilitate dynamically configurable erasure coding in heterogenous computing and storage environments. As an option, one or more variations of EC configuration selection technique 500 or any aspect thereof may be implemented in the context of the architecture and functionality of the embodiments described herein. The EC configuration selection technique 500 or any aspect thereof may be implemented in any environment.

The EC configuration selection technique 500 presents one embodiment of certain steps and/or operations for selecting and/or prioritizing for deployment one or more candidate EC configurations according to the herein disclosed techniques. Certain illustrations corresponding to the steps and/or operations comprising EC configuration selection technique 500 are also shown for reference.

Specifically, EC configuration selection technique 500 can commence by accessing a set of erasure coding configuration constraints (step 502) and a set of erasure coding configuration objectives (step 504). For example, erasure coding configuration constraints 4023 might be accessed to establish a fault tolerance constraint of "faultTolerance=K" and an availability domain count constraint of "availDomains=N+2K". Further, erasure coding configuration objectives 4043 might be accessed to establish a first objective to maximize the erasure coding storage space savings (e.g., "(max)spaceSavings") and a second objective to maximize the data access performance in the presence (or absence) of an erasure coding implementation (e.g., "(max) performance"). In some cases, such constraints and/or objectives can be derived automatically from, for example, a continuous monitoring of the heterogenous computing and storage environment. In other cases, the constraints and/or objectives can be specified by a user (e.g., enterprise system administrator, distributed system provider, etc.).

Step 506 serves to determine the objective space bounding coordinates of a set of candidate EC configurations. based on the objectives, and subject to the erasure coding configuration constraints. For example, the bounding area in a multidimensional objective space that characterizes a set of possible configurations might be based on the value of "K" (e.g., fault tolerance value), the value of "N+2 K" (e.g., the number of availability domains), and/or other objectives and constraints.

To facilitate comparison of the candidate erasure coding configurations, the configurations are plotted in an objective space defined by a set of quantitative objectives, such as erasure coding configuration objectives 4043 earlier described (step 508). For example, a set of plotted candidate EC configurations 522 can be plotted in a two-dimensional objective space defined by a storage space savings objective and a performance objective. Any number of other objectives is possible. In some cases, a storage space savings predictive model and/or a performance predictive model might be used to determine a position and/or bounding area for a particular candidate EC configuration in the objective space. For example, such predictive models might consume certain attributes (e.g., access patterns, storage location, etc.) pertaining to the data units of a particular EC configuration to determine a predicted cost savings value and/or performance value that can be used to plot the configuration in the objective space.

An objective function relating the objectives (e.g., storage space savings value and performance value) in the objective space can be applied to the candidate erasure coding configurations to classify them (step 510). As an example, objective function 524 might have characteristics that identify the points in the objective space where the storage space savings value is equivalent to the performance value, in accordance with some normalization scheme. Other characteristics (e.g., slopes, polynomial orders, etc.) pertaining to the objective function are possible. In this case, and as can be observed, the candidate EC configurations to the right of and above the objective function 524 (e.g., in the increasing scores direction) are identified as qualified candidates 528 (e.g., the particular combination of the candidate's cost/space savings value and the candidate's performance value is acceptable), while the remaining candidate erasure coding configurations are identified as disqualified candidates 526 (e.g., the combined cost/space savings and performance is not acceptable).

The candidate EC configurations can further be compared by computing a configuration score for all or a portion of (e.g., only the qualified candidates 528) the candidate EC configurations (step 512). As illustrated, higher configuration scores correspond to qualified candidates that have an increasingly higher combined value pertaining to storage space savings and performance. In some cases, the configuration scores can account for a relative weighting of the objectives. For example, an enterprise might determine performance is paramount to storage space savings and establish a 2:1 relative weighting of performance over storage space savings. In this case, the configuration score can represent this weighting relationship in a single computed value so as to facilitate comparison of the EC configurations subject to the enterprise weighting. The configuration scores can then be used to identify one or more selected EC configurations for implementation (step 514). In some cases, the configuration scores are used to assign a deployment priority 530 to the selected EC configurations (step 516). For example, the highest impact (e.g., the highest scoring) EC configurations are to be considered and/or deployed or implemented ahead of lower impact configurations. This is shown in the ordering by decreasing score that is used to assign configurations into an organization by deployment priority In some cases, earlier deployed EC configurations might be converted to one or more new EC configurations. An embodiment of a technique for performing such conversions is shown and described as pertaining to FIG. 6.

Figure 6:
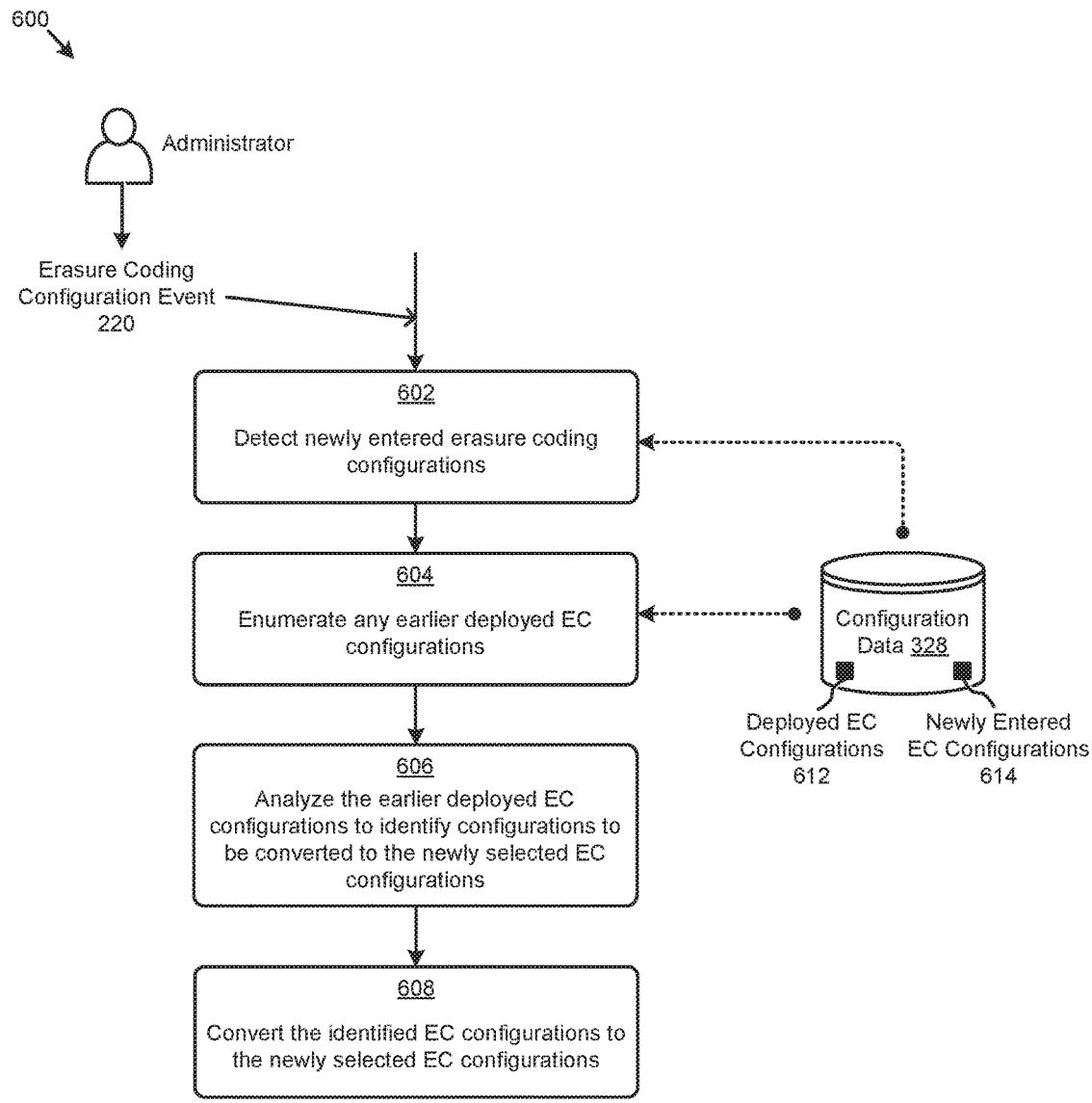
FIG. 6 presents an EC conversion technique as used in systems that facilitate dynamically configurable erasure coding in heterogenous computing and storage environments, according to an embodiment.

FIG. 6 presents an EC conversion technique 600 as used in systems that facilitate dynamically configurable erasure coding in heterogenous computing and storage environments. As an option, one or more variations of EC conversion technique 600 or any aspect thereof may be implemented in the context of the architecture and functionality of the embodiments described herein. The EC conversion technique 600 or any aspect thereof may be implemented in any environment.

The EC conversion technique 600 presents one embodiment of certain steps and/or operations for converting earlier deployed erasure coding implementations to erasure coding configurations dynamically generated and/or selected according to the herein disclosed techniques.

Specifically, EC conversion technique 600 can commence by detecting an erasure coding configuration event 220 that affects the composition of the erasure coding configurations (step 602). The configuration data 328 (e.g., earlier shown and described as pertains to FIG. 3) might have an associated listener, which can respond to a detected update event by consulting the configuration data 328 to consider one or more instances of newly entered EC configurations 614 that are recorded in configuration data 328. Any earlier deployed EC configurations are then enumerated (step 604). For example, a "deployed" flag associated with the EC configurations recorded in configuration data 328 might be accessed to enumerate a set of deployed EC configurations 612. The deployed EC configurations 612 are then analyzed to identify any configurations to be replaced with a corresponding instance of the newly selected EC configurations (step 606). For example, an earlier deployed "[4:1]" EC configuration might be replaced with a newly selected "[2:2]" EC configuration which was established to comply with a fault tolerance increase (e.g., from "FT=1" to "FT=2"). The conversion of the identified EC configurations to the newly selected EC configurations is then performed (step 608). In some cases, the amount of data movement incurred for a given conversion can be managed. For example, in the foregoing case where the number of data units in the EC strip is reduced (e.g., from "4" to "1"), the data unit or units with the highest garbage content are selected to exclude from the new EC strip such that the amount of data to be replicated is minimized.

Figure 7A:
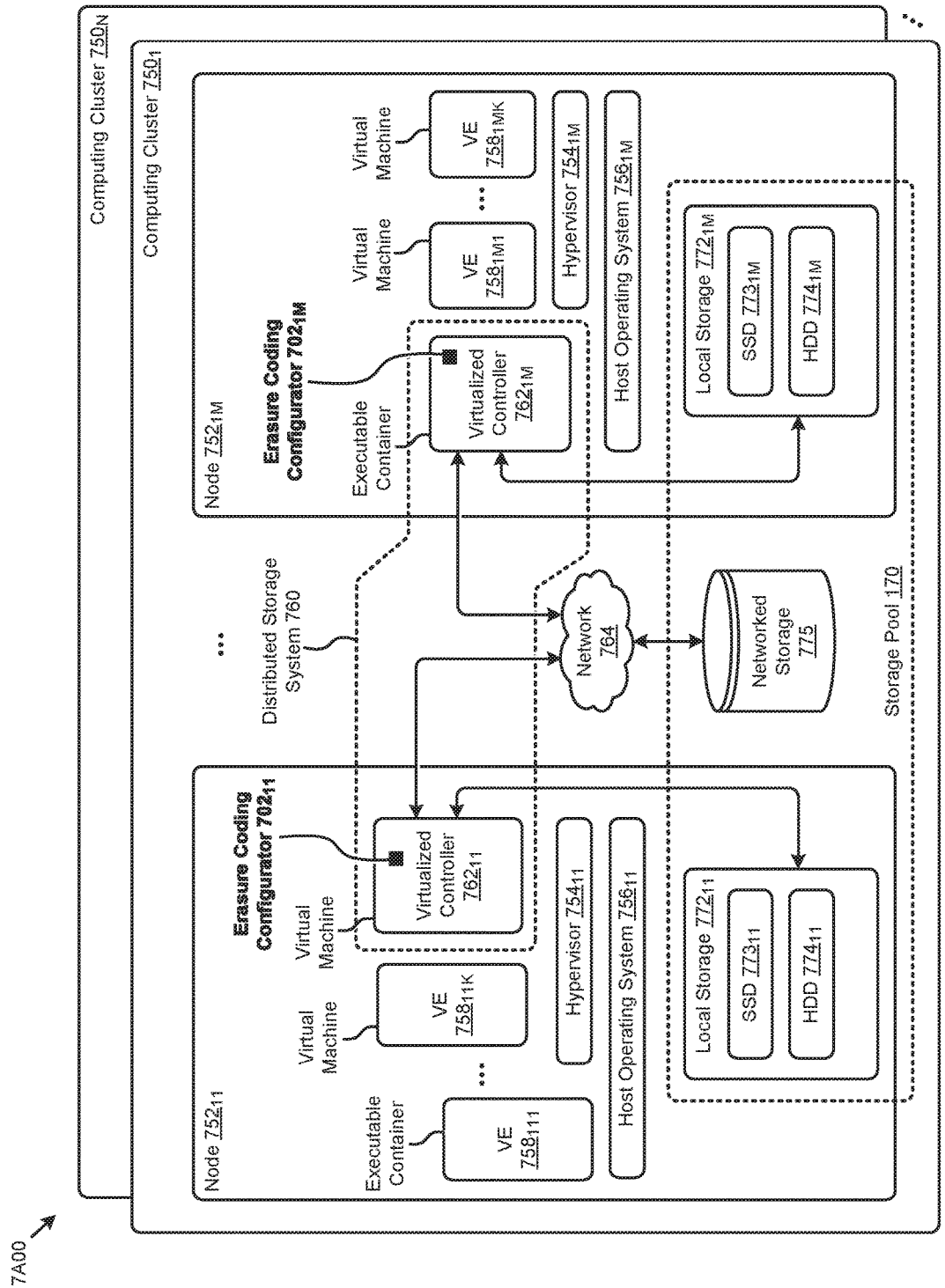
FIG. 7A depicts a distributed virtualization environment in which embodiments of the present disclosure can be implemented.

An example of a distributed virtualization environment (e.g., distributed computing and storage environment, hyperconverged distributed computing environment, etc.) that supports any of the herein disclosed techniques is presented and discussed as pertains to FIG. 7A.

FIG. 7A depicts a distributed virtualization environment 7A00 in which embodiments of the present disclosure can be implemented. As an option, one or more variations of distributed virtualization environment 7A00 or any aspect thereof may be implemented in the context of the architecture and functionality of the embodiments described herein.

The shown distributed virtualization environment depicts various components associated with one instance of a distributed virtualization system (e.g., hyperconverged distributed system) comprising a distributed storage system 760 that can be used to implement the herein disclosed techniques. Specifically, the distributed virtualization environment 7A00 comprises multiple computing clusters (e.g., computing cluster $750_1$, . . . , computing cluster $750_N$) comprising multiple nodes that have multiple tiers of storage in a storage pool. Representative nodes (e.g., node $752_{11}$, . . . , node $752_{1M}$) and storage pool 170 associated with cluster $750_1$ are shown. Each node can be associated with one server, multiple servers, or portions of a server. The nodes can be associated (e.g., logically and/or physically) with the clusters.

Each node comprises a virtualized controller that exports one or more block devices or NFS server targets that appear as disks to the virtual machines. These disks are virtual disks, since they are implemented by the software running inside the virtualized controllers. Thus, to any particular virtual machine, the virtualized controller appears to be exporting a clustered storage appliance that contains some disks. All user data (including the operating system) in the virtual machines resides on these virtual disks.

Significant performance advantages can be gained by allowing the virtualization system to access and utilize local storage (e.g., local storage $772_{11}$, local storage $772_{1M}$) in a shared storage pool. This is because I/O performance is typically much faster when performing access to local storage as compared to performing access to networked storage 775 across a network. This faster performance for locally attached storage can be increased even further by using certain types of optimized local storage devices, such as solid state storage devices.

Once the virtualization system is capable of managing and accessing locally attached storage, as is the case with the present embodiment, various optimizations can then be implemented to improve system performance even further. For example, the data to be stored in the various storage devices can be analyzed and categorized to determine which specific device should optimally be used to store the items of data. Data that needs to be accessed much faster or more frequently can be identified for storage in the locally attached storage. On the other hand, data that does not require fast access or which is accessed infrequently can be stored in the networked storage devices or in cloud storage.

Another advantage provided by this approach is that administration activities can be handled on a much more efficient granular level. Recall that the prior art approaches of using a legacy storage appliance in conjunction with VMFS heavily relies on what the hypervisor can do at its own layer with individual "virtual hard disk" files, effectively making all storage array capabilities meaningless. This is because the storage array manages much coarser grained volumes while the hypervisor needs to manage finer-grained virtual disks. In contrast, the present embodiment can be used to implement administrative tasks at much smaller levels of granularity.

As shown, the multiple tiers of storage include storage that is accessible through a network 764, such as a networked storage 775 (e.g., a storage area network or SAN, network attached storage or NAS, etc.). The multiple tiers of storage further include instances of local storage (e.g., local storage $772_{11}$, . . . , local storage $772_{1M}$). For example, the local storage can be within or directly attached to a server and/or appliance associated with the nodes. Such local storage can include solid state drives (SSD $773_{11}$, . . . , SSD $773_{1M}$), hard disk drives (HDD $774_{11}$, HDD $774_{1M}$), and/or other storage devices.

As shown, the nodes in the distributed virtualization environment 7A00 can implement one or more user virtualized entities (e.g., VE $758_{111}$, VE $758_{11K}$, VE $758_{1M1}$, VE $758_{1MK}$), such as virtual machines (VMs) and/or containers. The VMs can be characterized as software-based computing "machines" implemented in a hypervisor-assisted virtualization environment that emulates the underlying hardware resources (e.g., CPU, memory, etc.) of the nodes. For example, multiple VMs can operate on one physical machine (e.g., node host computer) running a single host operating system (e.g., host operating system $756_{11}$, . . . , host operating system $756_{1M}$), while the VMs run multiple applications on various respective guest operating systems. Such flexibility can be facilitated at least in part by a hypervisor (e.g., hypervisor $754_{11}$, hypervisor $754_{1M}$), which hypervisor is logically located between the various guest operating systems of the VMs and the host operating system of the physical infrastructure (e.g., node).

As an example, hypervisors can be implemented using virtualization software (e.g., VMware ESXi, Microsoft Hyper-V, RedHat KVM, Nutanix AHV, etc.) that includes a hypervisor. In comparison, the containers (e.g., application containers or ACs) are implemented at the nodes in an operating system virtualization environment or container virtualization environment. The containers comprise groups of processes and/or resources (e.g., memory, CPU, disk, etc.) that are isolated from the node host computer and other containers. Such containers directly interface with the kernel of the host operating system (e.g., host operating system $756_{11}$, . . . , host operating system $756_{1M}$) without, in most cases, a hypervisor layer. This lightweight implementation can facilitate efficient distribution of certain software components, such as applications or services (e.g., micro-services). As shown, distributed virtualization environment 7A00 can implement both a hypervisor-assisted virtualization environment and a container virtualization environment for various purposes.

Distributed virtualization environment 7A00 also comprises at least one instance of a virtualized controller to facilitate access to storage pool 170 by the VMs and/or containers.

As used in these embodiments, a virtualized controller is a collection of software instructions that serve to abstract details of underlying hardware or software components from one or more higher-level processing entities. A virtualized controller can be implemented as a virtual machine, as a container (e.g., a Docker container), or within a layer (e.g., such as a layer in a hypervisor).

Multiple instances of such virtualized controllers can coordinate within a cluster to form the distributed storage system 760 which can, among other operations, manage the storage pool 170. This architecture further facilitates efficient scaling of the distributed virtualization system. The foregoing virtualized controllers can be implemented in distributed virtualization environment 7A00 using various techniques. Specifically, an instance of a virtual machine at a given node can be used as a virtualized controller in a hypervisor-assisted virtualization environment to manage storage and I/O activities. In this case, for example, the virtualized entities at node $752_{11}$ can interface with a controller virtual machine (e.g., virtualized controller $762_{11}$) through hypervisor $754_{11}$ to access the storage pool 170. In such cases, the controller virtual machine is not formed as part of specific implementations of a given hypervisor. Instead, the controller virtual machine can run as a virtual machine above the hypervisor at the various node host computers. When the controller virtual machines run above the hypervisors, varying virtual machine architectures and/or hypervisors can operate with the distributed storage system 760.

For example, a hypervisor at one node in the distributed storage system 760 might correspond to VMware ESXi software, and a hypervisor at another node in the distributed storage system 760 might correspond to Nutanix AHV software. As another virtualized controller implementation example, containers (e.g., Docker containers) can be used to implement a virtualized controller (e.g., virtualized controller $762_{1M}$) in an operating system virtualization environment at a given node. In this case, for example, the virtualized entities at node $752_{1M}$ can access the storage pool 170 by interfacing with a controller container (e.g., virtualized controller $762_{1M}$) through hypervisor $754_{1M}$ and/or the kernel of host operating system $756_{1M}$.

In certain embodiments, one or more instances of an erasure coding configurator can be implemented in the distributed storage system 760 to facilitate the herein disclosed techniques. Specifically, erasure coding configurator $702_{11}$ can be implemented in the virtualized controller $762_{11}$, and erasure coding configurator $702_{1M}$ can be implemented in the virtualized controller $762_{1M}$. Such instances of the virtualized controller can be implemented in any node in any cluster. Actions taken by one or more instances of the virtualized controller can apply to a node (or between nodes), and/or to a cluster (or between clusters), and/or between any resources or subsystems accessible by the virtualized controller or their agents (e.g., a erasure coding configurator). Also, one or more instances of the earlier described policy data, topology data, performance data, configuration data, and/or other data can be implemented in the storage pool 170 for access by the distributed storage system 760 and/or the erasure coding configurator to facilitate the herein disclosed techniques.

Figure 7B:
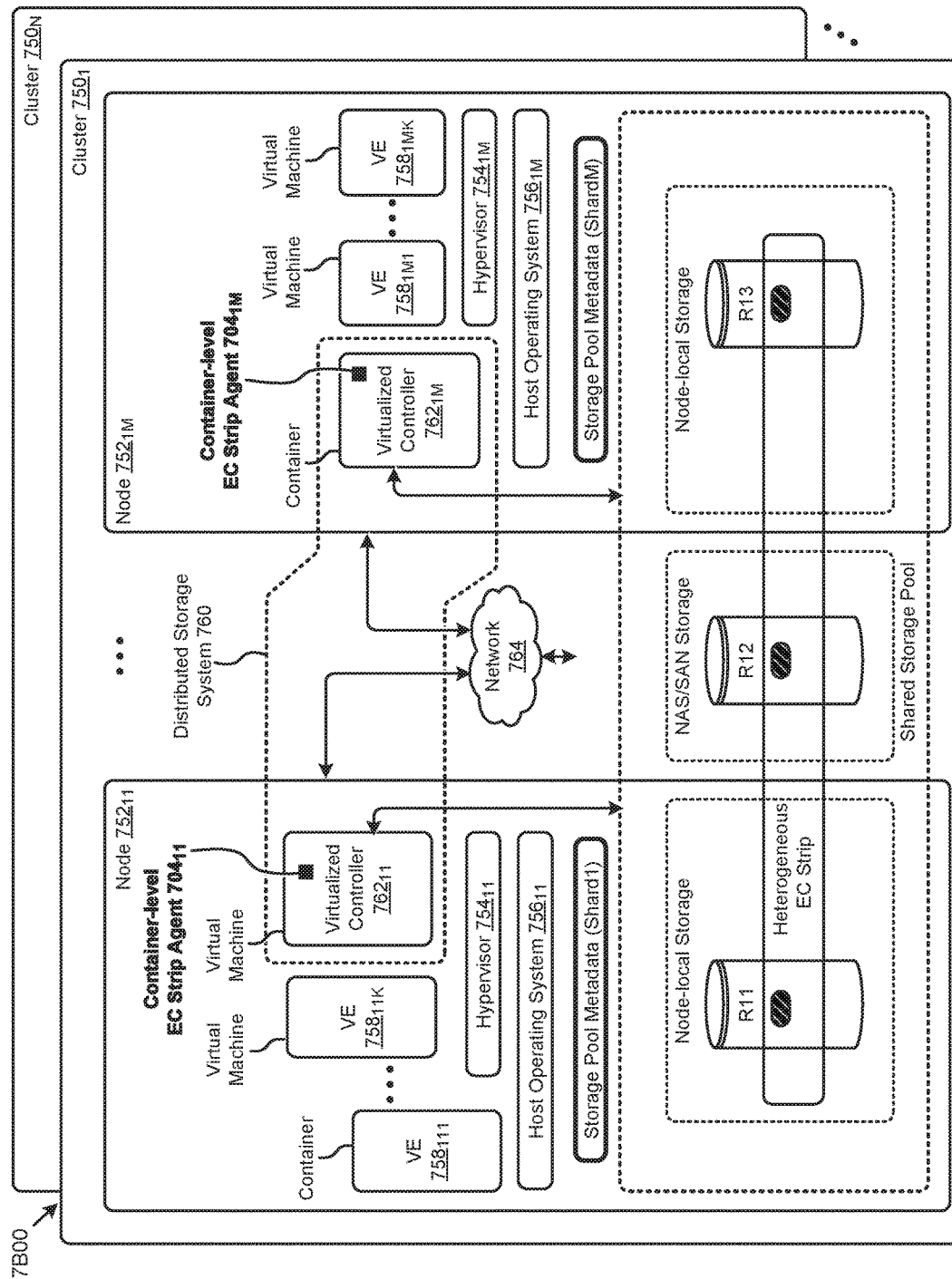
FIG. 7B is a schematic of a computing cluster having a shared storage pool that employs dynamic reconfiguration of fault tolerant erasure coding strips over extent groups of the shared storage pool, according to an embodiment.

FIG. 7B is a schematic of a computing cluster having a shared storage pool 7B00 that employs dynamic reconfiguration of fault tolerant erasure coding strips over extent groups of the shared storage pool. As an option, one or more variations of shared storage pool 7B00 or any aspect thereof may be implemented in the context of the architecture and functionality of the embodiments described herein. The shared storage pool 7B00 or any aspect thereof may be implemented in any environment.

As shown, one or more instances of an EC striping agent can be implemented in the distributed storage system 760 to facilitate the herein disclosed techniques. An EC strip agent can be implemented as an executable container. In some cases, such an executable container can run "standalone" without aid of a hypervisor. In other situations, an executable container can be situated as an executable function within a virtual machine. Specifically, and as shown, a container-level EC strip agent $7041_1$ can be implemented in the virtualized controller $762_{11}$, and another container-level EC strip agent $7041M$ can be implemented in the virtualized controller $762_{1M}$. Such instances of the virtualized controller can be implemented in any node in any cluster. Actions taken by one or more instances of the virtualized controller can apply to a node (or between nodes), and/or to a cluster, and/or between any resources or subsystems accessible by the virtualized controller or their agents.

ADDITIONAL EMBODIMENTS OF THE DISCLOSURE

Additional Practical Application Examples

Figure 8:
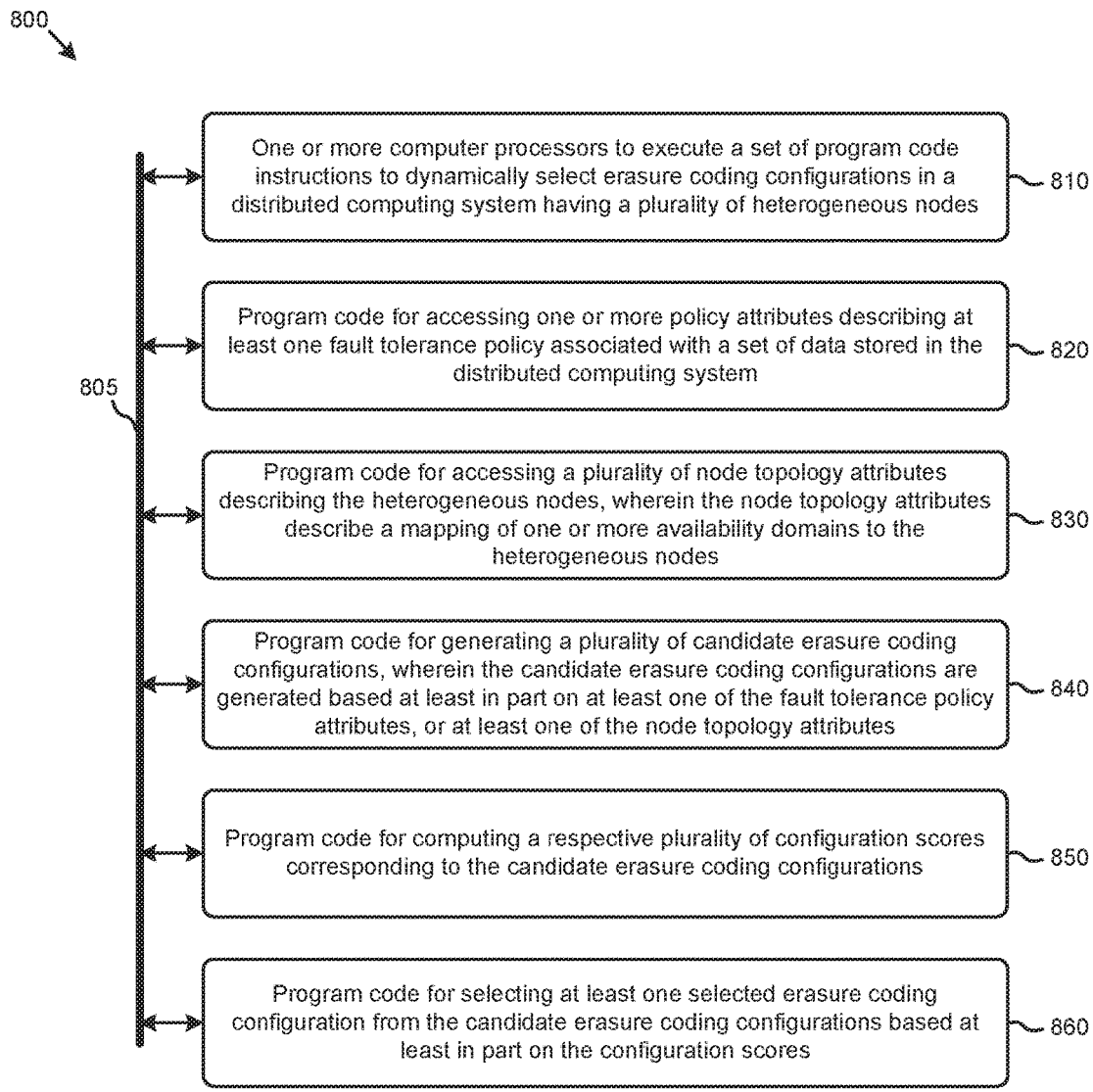
FIG. 8 depicts system components as arrangements of computing modules that are interconnected so as to implement certain of the herein-disclosed embodiments.

FIG. 8 depicts a system 800 as an arrangement of computing modules that are interconnected so as to operate cooperatively to implement certain of the herein-disclosed embodiments. This and other embodiments present particular arrangements of elements that, individually and/or as combined, serve to form improved technological processes that address problems attendant to efficiently implementing erasure coding in heterogeneous computing and storage systems. The partitioning of system 800 is merely illustrative and other partitions are possible. As an option, the system 800 may be implemented in the context of the architecture and functionality of the embodiments described herein. The system 800 comprises at least one processor and at least one memory, the memory serving to store program instructions corresponding to the operations of the system. As shown, an operation can be implemented in whole or in part using program instructions accessible by a module. The modules are connected to a communication path 805, and any operation can communicate with other operations over communication path 805. The modules of the system can, individually or in combination, perform method operations within system 800. Any operations performed within system 800 may be performed in any order unless as may be specified in the claims.

The shown embodiment implements a portion of a computer system, presented as system 800, comprising one or more computer processors to execute a set of program code instructions (module 810) and modules for accessing memory to hold program code instructions to perform: accessing one or more fault tolerance policy attributes describing at least one fault tolerance policy associated with a set of data stored in the distributed computing system (module 820); accessing a plurality of node topology attributes describing the heterogeneous nodes, wherein the node topology attributes describe a mapping of one or more availability domains to the heterogeneous nodes (module 830); generating a plurality of candidate erasure coding configurations, wherein the candidate erasure coding configurations are generated based at least in part on at least one of the fault tolerance policy attributes, or at least one of the node topology attributes (module 840); computing a respective plurality of configuration scores corresponding to the candidate erasure coding configurations (module 850); and selecting at least one selected erasure coding configuration from the candidate erasure coding configurations based at least in part on the configuration scores (module 860).

Figure 9A:
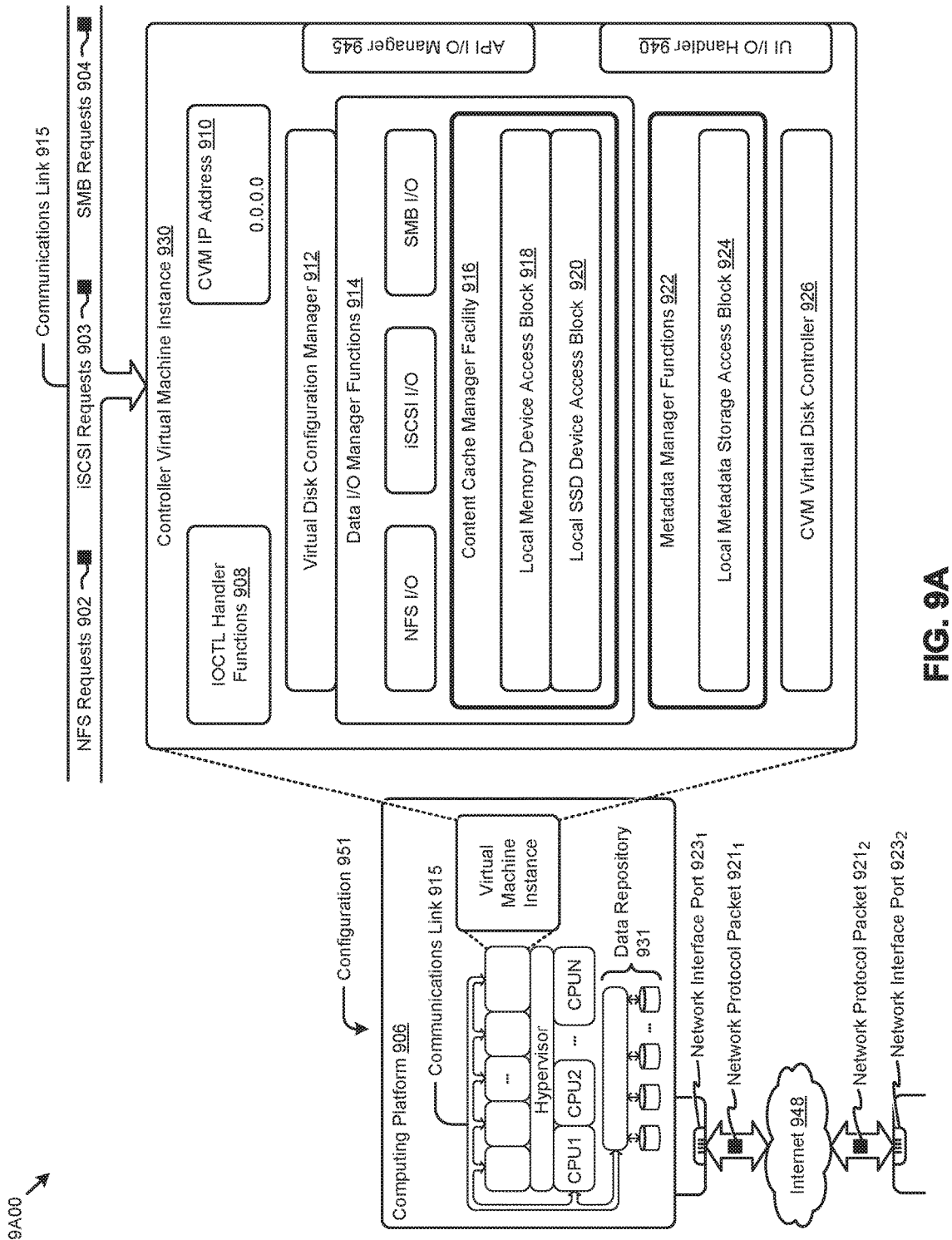
FIG. 9A, FIG. 9B and FIG. 9C depict virtualized controller architectures comprising collections of interconnected components suitable for implementing embodiments of the present disclosure and/or for use in the herein-described environments.

Variations of the foregoing may include more or fewer of the shown modules. Certain variations may perform more or fewer (or different) steps, and/or certain variations may use data elements in more, or in fewer (or different) operations. Still further, some embodiments include variations in the operations performed, and some embodiments include variations of aspects of the data elements used in the operations.
System Architecture Overview Additional System Architecture Examples FIG. 9A depicts a virtualized controller as implemented by the shown virtual machine architecture 9A00. The heretofore-disclosed embodiments, including variations of any virtualized controllers, can be implemented in distributed systems where a plurality of networked-connected devices communicate and coordinate actions using inter-component messaging. Distributed systems are systems of interconnected components that are designed for, or dedicated to, storage operations as well as being designed for, or dedicated to, computing and/or networking operations. Interconnected components in a distributed system can operate cooperatively to achieve a particular objective, such as to provide high performance computing, high performance networking capabilities, and/or high performance storage and/or high capacity storage capabilities. For example, a first set of components of a distributed computing system can coordinate to efficiently use a set of computational or compute resources, while a second set of components of the same distributed storage system can coordinate to efficiently use a set of data storage facilities.

A hyperconverged system coordinates the efficient use of compute and storage resources by and between the components of the distributed system. Adding a hyperconverged unit to a hyperconverged system expands the system in multiple dimensions. As an example, adding a hyperconverged unit to a hyperconverged system can expand the system in the dimension of storage capacity while concurrently expanding the system in the dimension of computing capacity and also in the dimension of networking bandwidth. Components of any of the foregoing distributed systems can comprise physically and/or logically distributed autonomous entities.

Physical and/or logical collections of such autonomous entities can sometimes be referred to as nodes. In some hyperconverged systems, compute and storage resources can be integrated into a unit of a node. Multiple nodes can be interrelated into an array of nodes, which nodes can be grouped into physical groupings (e.g., arrays) and/or into logical groupings or topologies of nodes (e.g., spoke-and-wheel topologies, rings, etc.). Some hyperconverged systems implement certain aspects of virtualization. For example, in a hypervisor-assisted virtualization environment, certain of the autonomous entities of a distributed system can be implemented as virtual machines. As another example, in some virtualization environments, autonomous entities of a distributed system can be implemented as executable containers. In some systems and/or environments, hypervisor-assisted virtualization techniques and operating system virtualization techniques are combined.

As shown, the virtual machine architecture 9A00 comprises a collection of interconnected components suitable for implementing embodiments of the present disclosure and/or for use in the herein-described environments. Moreover, the shown virtual machine architecture 9A00 includes a virtual machine instance in configuration 951 that is further described as pertaining to controller virtual machine instance 930. Configuration 951 supports virtual machine instances that are deployed as user virtual machines, or controller virtual machines or both. Such virtual machines interface with a hypervisor (as shown). Some virtual machines include processing of storage I/O as received from any or every source within the computing platform. An example implementation of such a virtual machine that processes storage I/O is depicted as 930.

In this and other configurations, a controller virtual machine instance receives block I/O (input/output or IO) storage requests as network file system (NFS) requests in the form of NFS requests 902, and/or internet small computer storage interface (iSCSI) block IO requests in the form of iSCSI requests 903, and/or Samba file system (SMB) requests in the form of SMB requests 904. The controller virtual machine (CVM) instance publishes and responds to an internet protocol (IP) address (e.g., CVM IP address 910). Various forms of input and output (I/O or IO) can be handled by one or more IO control handler functions (e.g., IOCTL handler functions 908) that interface to other functions such as data IO manager functions 914 and/or metadata manager functions 922. As shown, the data IO manager functions can include communication with virtual disk configuration manager 912 and/or can include direct or indirect communication with any of various block IO functions (e.g., NFS IO, iSCSI IO, SMB IO, etc.).

In addition to block IO functions, configuration 951 supports IO of any form (e.g., block IO, streaming IO, packet-based IO, HTTP traffic, etc.) through either or both of a user interface (UI) handler such as UI IO handler 940 and/or through any of a range of application programming interfaces (APIs), possibly through the shown API IO manager 945.

Communications link 915 can be configured to transmit (e.g., send, receive, signal, etc.) any type of communications packets comprising any organization of data items. The data items can comprise a payload data, a destination address (e.g., a destination IP address) and a source address (e.g., a source IP address), and can include various packet processing techniques (e.g., tunneling), encodings (e.g., encryption), and/or formatting of bit fields into fixed-length blocks or into variable length fields used to populate the payload. In some cases, packet characteristics include a version identifier, a packet or payload length, a traffic class, a flow label, etc. In some cases the payload comprises a data structure that is encoded and/or formatted to fit into byte or word boundaries of the packet.

In some embodiments, hard-wired circuitry may be used in place of, or in combination with, software instructions to implement aspects of the disclosure. Thus, embodiments of the disclosure are not limited to any specific combination of hardware circuitry and/or software. In embodiments, the term "logic" shall mean any combination of software or hardware that is used to implement all or part of the disclosure.

The term "computer readable medium" or "computer usable medium" as used herein refers to any medium that participates in providing instructions to a data processor for execution. Such a medium may take many forms including, but not limited to, non-volatile media and volatile media. Non-volatile media includes any non-volatile storage medium, for example, solid state storage devices (SSDs) or optical or magnetic disks such as disk drives or tape drives. Volatile media includes dynamic memory such as random access memory. As shown, controller virtual machine instance 930 includes content cache manager facility 916 that accesses storage locations, possibly including local dynamic random access memory (DRAM) (e.g., through the local memory device access block 918) and/or possibly including accesses to local solid state storage (e.g., through local SSD device access block 920).

Common forms of computer readable media include any non-transitory computer readable medium, for example, floppy disk, flexible disk, hard disk, magnetic tape, or any other magnetic medium; CD-ROM or any other optical medium; punch cards, paper tape, or any other physical medium with patterns of holes; or any RAM, PROM, EPROM, FLASH-EPROM, or any other memory chip or cartridge. Any data can be stored, for example, in any form of external data repository 931, which in turn can be formatted into any one or more storage areas, and which can comprise parameterized storage accessible by a key (e.g., a filename, a table name, a block address, an offset address, etc.). External data repository 931 can store any forms of data, and may comprise a storage area dedicated to storage of metadata pertaining to the stored forms of data. In some cases, metadata can be divided into portions. Such portions and/or cache copies can be stored in the external storage data repository and/or in a local storage area (e.g., in local DRAM areas and/or in local SSD areas). Such local storage can be accessed using functions provided by local metadata storage access block 924. External data repository 931 can be configured using CVM virtual disk controller 926, which can in turn manage any number or any configuration of virtual disks.

Execution of the sequences of instructions to practice certain embodiments of the disclosure are performed by one or more instances of a software instruction processor, or a processing element such as a data processor, or such as a central processing unit (e.g., CPU1, CPU2, . . . , CPUN). According to certain embodiments of the disclosure, two or more instances of configuration 951 can be coupled by communications link 915 (e.g., backplane, LAN, PSTN, wired or wireless network, etc.) and each instance may perform respective portions of sequences of instructions as may be required to practice embodiments of the disclosure.

The shown computing platform 906 is interconnected to the Internet 948 through one or more network interface ports (e.g., network interface port $923_1$ and network interface port $923_2$). Configuration 951 can be addressed through one or more network interface ports using an IP address. Any operational element within computing platform 906 can perform sending and receiving operations using any of a range of network protocols, possibly including network protocols that send and receive packets (e.g., network protocol packet $921_1$ and network protocol packet $921_2$).

Computing platform 906 may transmit and receive messages that can be composed of configuration data and/or any other forms of data and/or instructions organized into a data structure (e.g., communications packets). In some cases, the data structure includes program code instructions (e.g., application code) communicated through the Internet 948 and/or through any one or more instances of communications link 915. Received program code may be processed and/or executed by a CPU as it is received and/or program code may be stored in any volatile or non-volatile storage for later execution. Program code can be transmitted via an upload (e.g., an upload from an access device over the Internet 948 to computing platform 906). Further, program code and/or the results of executing program code can be delivered to a particular user via a download (e.g., a download from computing platform 906 over the Internet 948 to an access device).

Configuration 951 is merely one sample configuration. Other configurations or partitions can include further data processors, and/or multiple communications interfaces, and/or multiple storage devices, etc. within a partition. For example, a partition can bound a multi-core processor (e.g., possibly including embedded or collocated memory), or a partition can bound a computing cluster having a plurality of computing elements, any of which computing elements are connected directly or indirectly to a communications link. A first partition can be configured to communicate to a second partition. A particular first partition and a particular second partition can be congruent (e.g., in a processing element array) or can be different (e.g., comprising disjoint sets of components).

A cluster is often embodied as a collection of computing nodes that can communicate between each other through a local area network (e.g., LAN or virtual LAN (VLAN)) or a backplane. Some clusters are characterized by assignment of a particular set of the aforementioned computing nodes to access a shared storage facility that is also configured to communicate over the local area network or backplane. In many cases, the physical bounds of a cluster are defined by a mechanical structure such as a cabinet or such as a chassis or rack that hosts a finite number of mounted-in computing units. A computing unit in a rack can take on a role as a server, or as a storage unit, or as a networking unit, or any combination therefrom. In some cases, a unit in a rack is dedicated to provisioning of power to the other units. In some cases, a unit in a rack is dedicated to environmental conditioning functions such as filtering and movement of air through the rack and/or temperature control for the rack. Racks can be combined to form larger clusters. For example, the LAN of a first rack having 32 computing nodes can be interfaced with the LAN of a second rack having 16 nodes to form a two-rack cluster of 48 nodes. The former two LANs can be configured as subnets, or can be configured as one VLAN. Multiple clusters can communicate between one module to another over a WAN (e.g., when geographically distal) or a LAN (e.g., when geographically proximal).

A module as used herein can be implemented using any mix of any portions of memory and any extent of hard-wired circuitry including hard-wired circuitry embodied as a data processor. Some embodiments of a module include one or more special-purpose hardware components (e.g., power control, logic, sensors, transducers, etc.). A data processor can be organized to execute a processing entity that is configured to execute as a single process or configured to execute using multiple concurrent processes to perform work. A processing entity can be hardware-based (e.g., involving one or more cores) or software-based, and/or can be formed using a combination of hardware and software that implements logic, and/or can carry out computations and/or processing steps using one or more processes and/or one or more tasks and/or one or more threads or any combination thereof.

Some embodiments of a module include instructions that are stored in a memory for execution so as to implement algorithms that facilitate operational and/or performance characteristics pertaining to dynamically configurable erasure coding in heterogenous computing and storage environments. In some embodiments, a module may include one or more state machines and/or combinational logic used to implement or facilitate the operational and/or performance characteristics pertaining to dynamically configurable erasure coding in heterogenous computing and storage environments.

Various implementations of the data repository comprise storage media organized to hold a series of records or files such that individual records or files are accessed using a name or key (e.g., a primary key or a combination of keys and/or query clauses). Such files or records can be organized into one or more data structures (e.g., data structures used to implement or facilitate aspects of dynamically configurable erasure coding in heterogenous computing and storage environments). Such files or records can be brought into and/or stored in volatile or non-volatile memory. More specifically, the occurrence and organization of the foregoing files, records, and data structures improve the way that the computer stores and retrieves data in memory, for example, to improve the way data is accessed when the computer is performing operations pertaining to dynamically configurable erasure coding in heterogenous computing and storage environments, and/or for improving the way data is manipulated when performing computerized operations pertaining to implementing a multi-objective selection technique to dynamically select erasure coding configurations in heterogeneous computing and storage systems.

Further details regarding general approaches to managing data repositories are described in U.S. Pat. No. 8,601,473 titled "ARCHITECTURE FOR MANAGING I/O AND STORAGE FOR A VIRTUALIZATION ENVIRONMENT", issued on Dec. 3, 2013, which is hereby incorporated by reference in its entirety.

Further details regarding general approaches to managing and maintaining data in data repositories are described in U.S. Pat. No. 8,549,518 titled "METHOD AND SYSTEM FOR IMPLEMENTING MAINTENANCE SERVICE FOR MANAGING I/O AND STORAGE FOR A VIRTUALIZATION ENVIRONMENT", issued on Oct. 1, 2013, which is hereby incorporated by reference in its entirety.

Figure 9B:
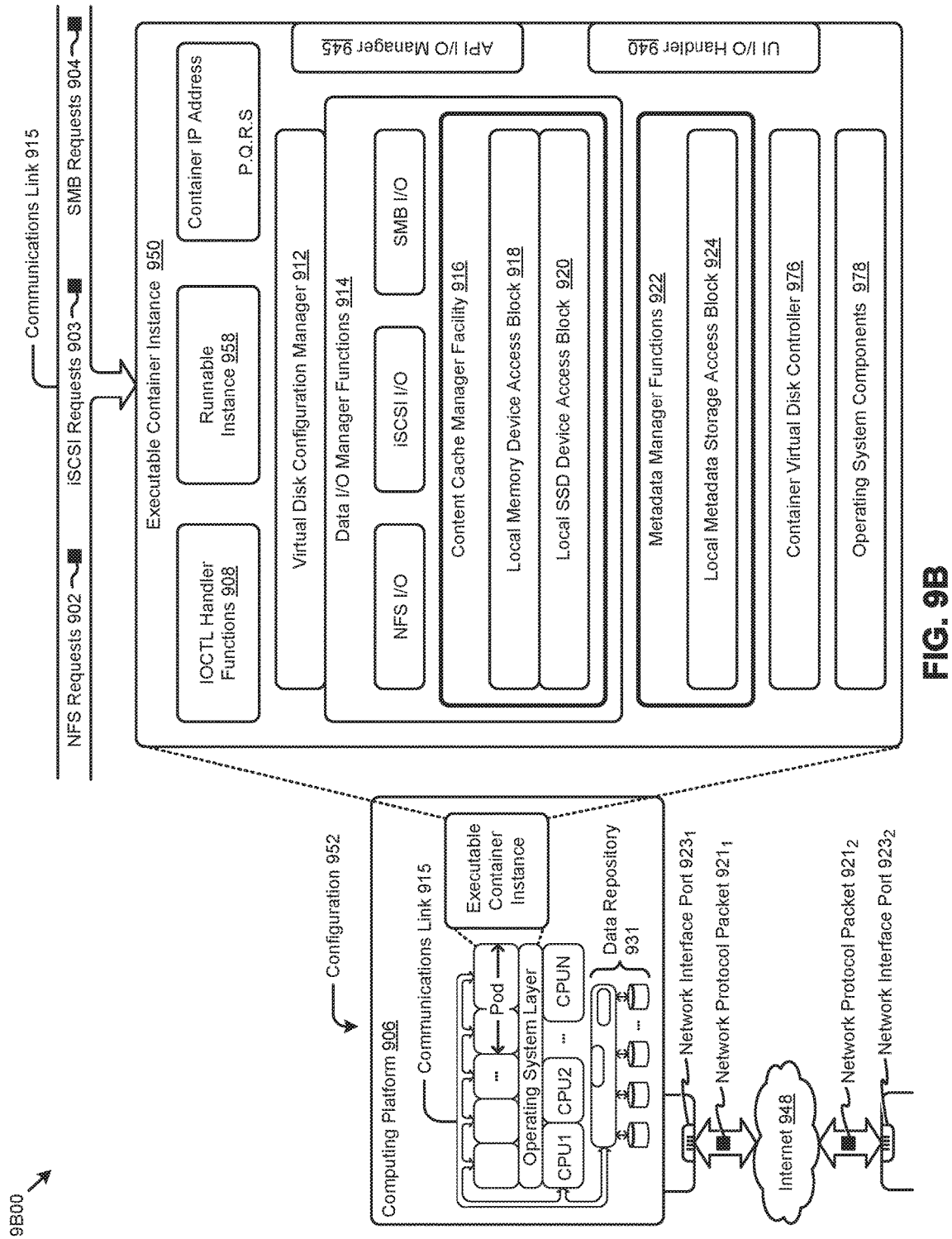

FIG. 9B depicts a virtualized controller implemented by containerized architecture 9B00. The containerized architecture comprises a collection of interconnected components suitable for implementing embodiments of the present disclosure and/or for use in the herein-described environments. Moreover, the shown containerized architecture 9B00 includes an executable container instance in configuration 952 that is further described as pertaining to the executable container instance 950. Configuration 952 includes an operating system layer (as shown) that performs addressing functions such as providing access to external requestors via an IP address (e.g., "P.Q.R.S", as shown). Providing access to external requestors can include implementing all or portions of a protocol specification (e.g., "http:") and possibly handling port-specific functions.

The operating system layer can perform port forwarding to any executable container (e.g., executable container instance 950). An executable container instance can be executed by a processor. Runnable portions of an executable container instance sometimes derive from an executable container image, which in turn might include all, or portions of any of, a Java archive repository (JAR) and/or its contents, and/or a script or scripts and/or a directory of scripts, and/or a virtual machine configuration, and may include any dependencies therefrom. In some cases a configuration within an executable container might include an image comprising a minimum set of runnable code. Contents of larger libraries and/or code or data that would not be accessed during runtime of the executable container instance can be omitted from the larger library to form a smaller library composed of only the code or data that would be accessed during runtime of the executable container instance. In some cases, start-up time for an executable container instance can be much faster than start-up time for a virtual machine instance, at least inasmuch as the executable container image might be much smaller than a respective virtual machine instance. Furthermore, start-up time for an executable container instance can be much faster than start-up time for a virtual machine instance, at least inasmuch as the executable container image might have many fewer code and/or data initialization steps to perform than a respective virtual machine instance.

An executable container instance (e.g., a Docker container instance) can serve as an instance of an application container. Any executable container of any sort can be rooted in a directory system, and can be configured to be accessed by file system commands (e.g., "ls" or "ls-a", etc.). The executable container might optionally include operating system components 978, however such a separate set of operating system components need not be provided. As an alternative, an executable container can include runnable instance 958, which is built (e.g., through compilation and linking, or just-in-time compilation, etc.) to include all of the library and OS-like functions needed for execution of the runnable instance. In some cases, a runnable instance can be built with a virtual disk configuration manager, any of a variety of data IO management functions, etc. In some cases, a runnable instance includes code for, and access to, container virtual disk controller 976. Such a container virtual disk controller can perform any of the functions that the aforementioned CVM virtual disk controller 926 can perform, yet such a container virtual disk controller does not rely on a hypervisor or any particular operating system so as to perform its range of functions.

In some environments multiple executable containers can be collocated and/or can share one or more contexts. For example, multiple executable containers that share access to a virtual disk can be assembled into a pod (e.g., a Kubernetes pod). Pods provide sharing mechanisms (e.g., when multiple executable containers are amalgamated into the scope of a pod) as well as isolation mechanisms (e.g., such that the namespace scope of one pod does not share the namespace scope of another pod).

Figure 9C:
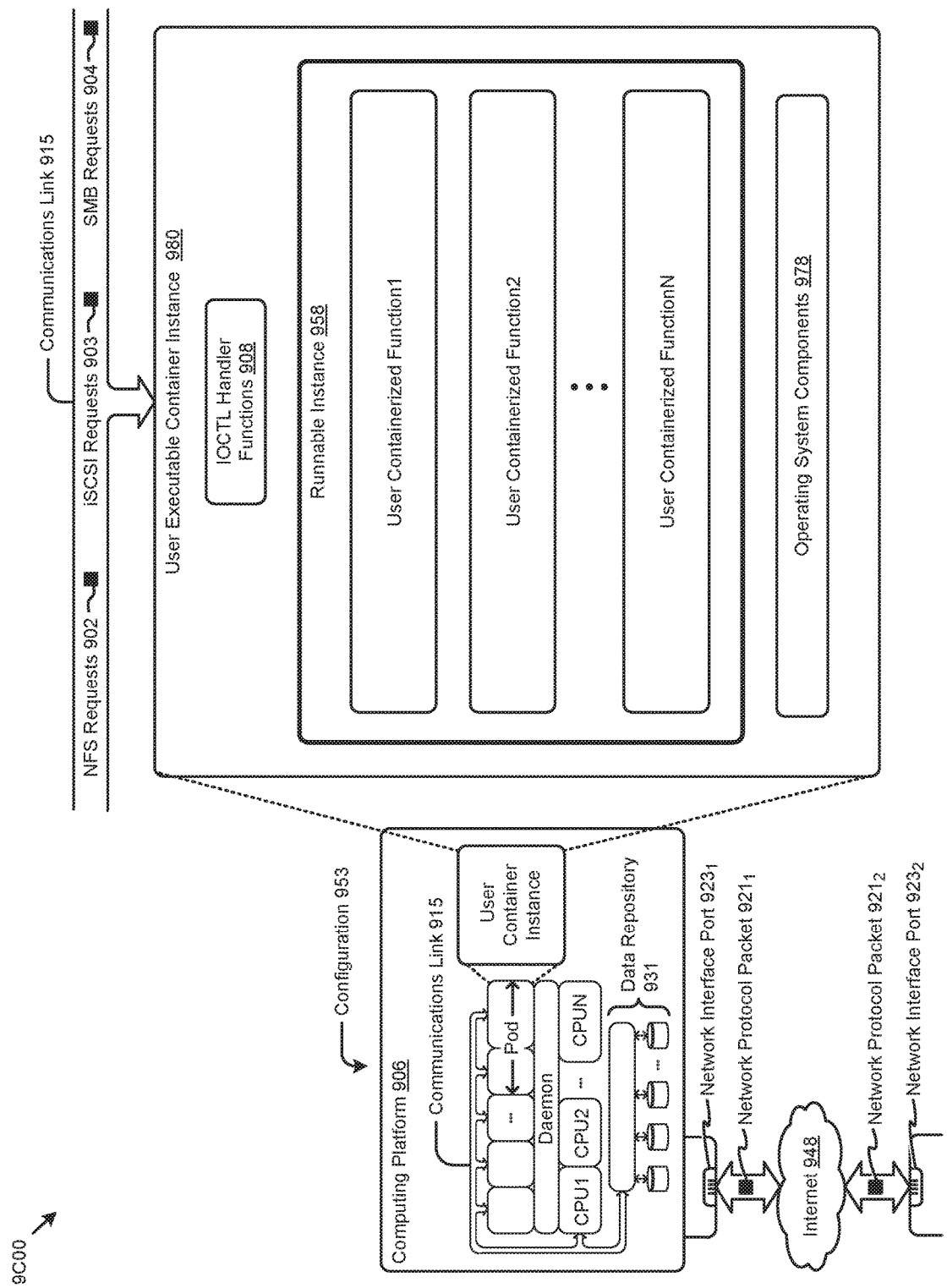

FIG. 9C depicts a virtualized controller implemented by a daemon-assisted containerized architecture 9C00. The containerized architecture comprises a collection of interconnected components suitable for implementing embodiments of the present disclosure and/or for use in the herein-described environments. Moreover, the shown daemon-assisted containerized architecture 9C00 includes a user executable container instance in configuration 953 that is further described as pertaining to user executable container instance 980. Configuration 953 includes a daemon layer (as shown) that performs certain functions of an operating system.

User executable container instance 980 comprises any number of user containerized functions (e.g., user containerized function1, user containerized function2, . . . , user containerized functionN). Such user containerized functions can execute autonomously, or can be interfaced with or wrapped in a runnable object to create a runnable instance (e.g., runnable instance 958). In some cases, the shown operating system components 978 comprise portions of an operating system, which portions are interfaced with or included in the runnable instance and/or any user containerized functions. In this embodiment of daemon-assisted containerized architecture 9C00, the computing platform 906 might or might not host operating system components other than operating system components 978. More specifically, the shown daemon might or might not host operating system components other than operating system components 978 of user executable container instance 980.

In the foregoing specification, the disclosure has been described with reference to specific embodiments thereof. It will however be evident that various modifications and changes may be made thereto without departing from the broader spirit and scope of the disclosure. For example, the above-described process flows are described with reference to a particular ordering of process actions. However, the ordering of many of the described process actions may be changed without affecting the scope or operation of the disclosure. The specification and drawings are to be regarded in an illustrative sense rather than in a restrictive sense.

What is claimed is:

1. A method comprising:
accessing a fault tolerance policy attribute describing a fault tolerance policy associated with a computing system;
accessing a computing node topology attribute that describes a location of a computing node of the computing system;
generating a plurality of candidate erasure coding configurations, wherein the candidate erasure coding configurations are generated based at least in part on at least one of, the fault tolerance policy attribute or the computing node topology attribute;
computing respective configuration scores corresponding to respective candidate erasure coding configurations of the plurality of candidate erasure coding configurations; and
selecting an erasure coding configuration from the plurality of candidate erasure coding configurations, the selecting being based at least in part on the respective configuration scores.

2. The method of claim 1, further comprising:
identifying at least one deployed erasure coding configuration, wherein the deployed erasure coding configuration is different from the selected erasure coding configuration; and
converting the deployed erasure coding configuration to the selected erasure coding configuration.

3. The method of claim 1, further comprising:
implementing a first selected erasure coding configuration to a first set of availability domains; and
implementing a second selected erasure coding configuration to a second set of availability domains.

4. The method of claim 1, wherein generating the candidate erasure coding configurations is responsive to an erasure coding configuration event.

5. The method of claim 4, wherein the erasure coding configuration event is triggered by at least one of, a user input, a policy change, or a topology change.

6. The method of claim 1, wherein a constraint is derived from at least one of the fault tolerance policy attribute or the computing node topology attribute, and wherein the candidate erasure coding configurations are generated subject to the constraint.

7. A non-transitory computer readable medium having stored thereon a sequence of instructions which, when executed by a processor causes a set of acts, the set of acts comprising:
accessing a fault tolerance policy attribute describing a fault tolerance policy associated with a computing system;

accessing a computing node topology attribute that describes a location of a computing node of the computing system;

generating a plurality of candidate erasure coding configurations, wherein the candidate erasure coding configurations are generated based at least in part on at least one of, the fault tolerance policy attribute or the computing node topology attribute;

computing respective configuration scores corresponding to respective candidate erasure coding configurations of the plurality of candidate erasure coding configurations; and selecting an erasure coding configuration from the plurality of candidate erasure coding configurations, the selecting being based at least in part on the respective configuration scores.

8. The computer readable medium of claim 7, wherein the respective configuration scores describe a quantitative relationship with at least one of, a performance objective, or a storage space savings objective.

9. The computer readable medium of claim 7, wherein the fault tolerance policy attribute characterizes at least one of, a fault tolerance value, a replication factor, an availability domain awareness setting, a computing node affinity, or an erasure coding objective.

10. The computer readable medium of claim 7, wherein the computing node topology attribute characterizes at least one of, a node identifier, an availability domain identifier, a site identifier, a host identifier, an IP address, or a node state.

11. The computer readable medium of claim 7, wherein a plurality of computing node topology attributes describe an availability domain.

12. The computer readable medium of claim 11, wherein the plurality of computing node topology attributes, provide a mapping between the availability domain and computing nodes.

13. The computer readable medium of claim 7, wherein an availability domain corresponds to the computing node, a block, a host, a site, an appliance, a rack, or a data center.

14. The computer readable medium of claim 7, wherein the set of acts further comprise:

identifying at least one deployed erasure coding configuration, wherein the deployed erasure coding configuration is different from the selected erasure coding configuration; and converting the deployed erasure coding configuration to the selected erasure coding configuration.

15. The computer readable medium of claim 7, wherein the set of acts further comprise:

implementing a first selected erasure coding configuration to a first set of availability domains; and implementing a second selected erasure coding configuration to a second set of availability domains.

16. The computer readable medium of claim 7, wherein generating the candidate erasure coding configurations is responsive to an erasure coding configuration event.

17. The computer readable medium of claim 16, wherein the erasure coding configuration event is triggered by at least one of, a user input, a policy change, or a topology change.

18. The computer readable medium of claim 7, wherein a constraint is derived from at least one of the fault tolerance policy attribute or the computing node topology attribute, and wherein the candidate erasure coding configurations are generated subject to the constraint.

19. A system comprising:

a storage medium having stored thereon a sequence of instructions; and a processor that executes the sequence of instructions to cause a set of acts, the set of acts comprising, accessing a fault tolerance policy attribute describing a fault tolerance policy associated with a computing system;

accessing a computing node topology attribute that describes a location of a computing node of the computing system;

generating a plurality of candidate erasure coding configurations, wherein the candidate erasure coding configurations are generated based at least in part on at least one of, the fault tolerance policy attribute or the computing node topology attribute;

computing respective configuration scores corresponding to respective candidate erasure coding configurations of the plurality of candidate erasure coding configurations; and selecting an erasure coding configuration from the plurality of candidate erasure coding configurations, the selecting being based at least in part on the respective configuration scores.

20. The system of claim 19, wherein a constraint is derived from at least one of the fault tolerance policy attribute or the computing node topology attribute, and wherein the candidate erasure coding configurations are generated subject to the constraint.

* * * * *